(12) United States Patent
Fujishima

(10) Patent No.: US 10,393,787 B2
(45) Date of Patent: Aug. 27, 2019

(54) C/N RATIO DETECTION CIRCUIT AND SIGNAL RECEIVING CIRCUIT

(71) Applicant: Panasonic Intellectual Property Management Co., Ltd., Osaka (JP)

(72) Inventor: Tomoyasu Fujishima, Kanagawa (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 41 days.

(21) Appl. No.: 15/542,410

(22) PCT Filed: Jan. 28, 2016

(86) PCT No.: PCT/JP2016/000425
§ 371 (c)(1),
(2) Date: Jul. 7, 2017

(87) PCT Pub. No.: WO2016/121393
PCT Pub. Date: Aug. 4, 2016

(65) Prior Publication Data
US 2018/0017605 A1 Jan. 18, 2018

(30) Foreign Application Priority Data

Jan. 28, 2015 (JP) .................. 2015-014282

(51) Int. Cl.
*G01R 29/26* (2006.01)
*H04B 1/16* (2006.01)
(Continued)

(52) U.S. Cl.
CPC ............ *G01R 29/26* (2013.01); *G01R 19/10* (2013.01); *G01R 23/005* (2013.01); *H04B 1/16* (2013.01);
(Continued)

(58) Field of Classification Search
None
See application file for complete search history.

(56) References Cited

U.S. PATENT DOCUMENTS 3,475,683 A * 10/1969 Hulland ................. G01R 29/26
324/140 R
4,220,923 A * 9/1980 Pelchat .................. H04B 7/002
327/553
5,703,954 A 12/1997 Dapper et al.

FOREIGN PATENT DOCUMENTS

| JP | 5-063593 | 3/1993 |
| JP | 2001-108720 | 4/2001 |
| JP | 2002-124931 | 4/2002 |

OTHER PUBLICATIONS

Stan Dodds, PHYS 331: Junior Physics Laboratory I; Jun. 26, 2008; www.owlnet.rice.edu/~dodds/Files331/noise_notes.pdf; pp. 1-13 (Year: 2008).*

(Continued)

*Primary Examiner* — Melissa J Koval
*Assistant Examiner* — Nasima Monsur
(74) *Attorney, Agent, or Firm* — Greenblum & Bernstein, P.C.

(57) ABSTRACT

A C/N ratio detection circuit includes a voltage detector, an averaging section, a time variation range calculator, and a C/N ratio calculator. The voltage detector measures an input voltage of a signal. The averaging section calculates an average of the input voltage over a predetermined time. The time variation range calculator calculates a time variation range of the input voltage over the predetermined time. The C/N ratio calculator calculates a C/N ratio of the signal by using the average and time variation range of the input voltage.

6 Claims, 18 Drawing Sheets

(51) Int. Cl.
    *H04B 17/336*     (2015.01)
    *G01R 19/10*     (2006.01)
    *G01R 23/00*     (2006.01)
    *H04L 27/20*     (2006.01)

(52) U.S. Cl.
    CPC ........ *H04B 17/336* (2015.01); *H04L 27/2017* (2013.01)

(56) References Cited

OTHER PUBLICATIONS

Stan Dodds; PHYS 331: Junior Physics Laboratory I-NPL date Document (Year: 2008).*
International Search Report of PCT application No. PCT/JP2016/000425 dated Apr. 19, 2016.
The Extended European Search Report dated Nov. 13, 2017 for the related European Patent Application No. 16742997.6.
David R Pauluzzi et al: "A Comparison of SNR Estimation Techniques for the AWGN Channel", IEEE Transactions on Communications, IEEE Service Center, Piscataway, NJ. USA, vol. 48, No. 10, Oct. 1, 2000 (Oct. 1, 2000), XP011009781.
Stan Dodds: "PHYS 331: Junior Physics Laboratory I Notes on Noise Reduction", Jun. 26, 2008 (Jun. 26, 2008), XP055421503, Retrieved from the Internet: URL:http://www.owlnet.rice.edu/~dodds/Files331/[retrieved on Nov. 3, 2017].

* cited by examiner

FIG. 7

| | COMPARATIVE RESULT | CORRECTED OUTPUT VALUE(S_dev_cor) |
|---|---|---|
| Case 1 | TIME VARIATION RANGE OF S METER S_dev ≥ NOISE LEVEL REFERENCE VALUE N_lv | TIME VARIATION RANGE S_dev OF S METER |
| Case 2 | TIME VARIATION RANGE S_dev OF S METER < NOISE LEVEL REFERENCE VALUE N_lv | NOISE LEVEL REFERENCE VALUE N_lv |

FIG. 15

| | COMPARATIVE RESULT | OUTPUT OF SWITCH 302 |
|---|---|---|
| Case 3 | DIFFERENCE BETWEEN C/N RATIO AND S METER FALLS WITHIN EXPECTED RANGE | C/N RATIO |
| Case 4 | DIFFERENCE BETWEEN C/N RATIO AND S METER FALLS OUTSIDE EXPECTED RANGE | S METER |

# C/N RATIO DETECTION CIRCUIT AND SIGNAL RECEIVING CIRCUIT

TECHNICAL FIELD

An aspect of the present disclosure relates to a C/N ratio detection circuit and a signal receiving circuit which are provided in, for example a radio receiver that receives a radio signal modulated with a modulation scheme of a constant amplitude, such as frequency modulation (FM).

BACKGROUND ART

When receiving a frequency modulation (FM) broadcast, conventional vehicle radios normally perform signal processes in accordance with a voltage of a received radio signal. Examples of such signal processes include a muting process for decreasing an output voltage of an audio signal (audio output voltage) and a high-frequency-component cutoff process for decreasing voltages of high-frequency components in sound. The reason why those processes are required is to mitigate the effects of noise that may be unpleasant sound under a weak electric field environment.

Right after a running vehicle enters a tunnel, for example, strength of an electric field around an antenna of a vehicle radio becomes weak. If an audio output voltage is unchanged after the vehicle has entered the tunnel, the vehicle radio may emit much louder noises inside the tunnel than before the vehicle enters the tunnel. This makes a driver feel unpleasant. For this reason, in response to the detection of a decreased voltage of a radio signal, the vehicle radio performs the muting process for decreasing an audio output voltage. For the same purpose, the vehicle radio also performs the high-frequency-component cutoff process for decreasing voltages of high-frequency components in sound.

Conventional vehicle radios have an antenna, called a rod antenna (with about 75 cm in length, for example). However, some modern vehicle radios have a more compact antenna, called a shark fin antenna (with about 10 cm in length, for example).

The above compact antenna is equipped with an antenna amplifier that amplifies a received signal in order to compensate for a low reception gain of a miniaturized antenna element. Such an antenna equipped with an antenna amplifier is referred to as an "active antenna". Unfortunately, the antenna amplifier of an active antenna amplifies not only a radio signal containing broadcast waves but also noise. As a result, compared to the rod antenna, the noise floor of active antennas becomes higher, and a radio signal voltage of active antennas does not decrease sufficiently even under a weak electric field environment.

In some cases, a radio signal voltage is used as a criterion (an operating point) for determining whether to perform the above audio signal processes. One index for indicating a radio signal voltage is an "S meter". In this description, the "S meter" represents a radio signal voltage at a reception channel which is to be tuned and demodulated by a radio receiver.

Comparing the cases of radio receivers with and without an antenna amplifier, there is a difference in the voltages (the S meters) of the received radio signals due to the gain of the antenna amplifier even when the input levels of the received signals are substantially same. Thus, if software programs for an audio signal process installed in both the radio receivers are configured such that an audio signal is muted based on an operating point related to an S meter preset without an antenna amplifier, there are cases where the radio receiver without an antenna amplifier does not mute the audio signal but the radio receiver with an antenna amplifier mutes the audio signal.

Thus, for example, when the vehicle is running inside a tunnel, the active antenna (in the case with an antenna amplifier) may fail to perform the signal process appropriately, and thus disadvantageously emits loud noise, for example.

To address the above disadvantages, an operating point may be varied for a signal process in accordance with a gain of an antenna amplifier when the antenna amplifier is used. It is more preferable to control an audio signal process by using a carrier to noise (C/N) ratio as an index representing the quality of a received radio signal, instead of an S meter, which is an index purely indicating a voltage of the radio signal.

A method has been proposed in Patent Literature 1, for example, as a conventional technique for detecting a C/N ratio. In this method, digital broadcast signals are demodulated and measured constellations are obtained. Then, errors (power ratios) between the measured constellations and theoretical constellations are measured as modulation error ratios (MERs) related one-to-one to C/N ratios.

A method has been proposed in Patent Literature 2, for example, as another conventional technique for detecting a C/N ratio. In this method, an input signal is demodulated and a baseband signal is obtained. Then, noise components that fall outside a signal bandwidth are extracted from the baseband signal. Based on levels of the extracted noise, a reception level of an input radio wave related to a C/N ratio is displayed.

CITATION LIST

Patent Literatures

PTL1: Unexamined Japanese Patent Publication No. 2002-124931
PTL2: Unexamined Japanese Patent Publication No. H05-63593 (1993)

SUMMARY OF THE INVENTION

The present disclosure provides a C/N ratio detection circuit and a signal receiving circuit that are capable of accurately calculating a C/N ratio of a received signal of an FM broadcast.

A carrier to noise (C/N) ratio detection circuit according to an aspect of the present disclosure includes a voltage detector, an averaging section, a time variation range calculator, and a C/N ratio calculator. The voltage detector measures an input voltage of a signal. The averaging section calculates an average of the input voltage over a predetermined time. The time variation range calculator calculates a time variation range of the input voltage over the predetermined time. The C/N ratio calculator calculates a C/N ratio of the signal by using the average and time variation range of the input voltage.

A signal receiving circuit according to an aspect of the present disclosure includes a demodulator, a C/N ratio detection circuit, and an audio signal processor. The demodulator demodulates a received signal. The C/N ratio detection circuit calculates a C/N ratio of the received signal. The audio signal processor applies an audio signal process to the received signal that has been demodulated, in accordance with the calculated C/N ratio. The C/N ratio detection circuit includes a voltage detector, an averaging section, a time variation range calculator, and a C/N ratio calculator. The voltage detector measures an input voltage of the received signal. The averaging section calculates an average of the input voltage over a predetermined time. The time variation range calculator calculates a time variation range of the input voltage over the predetermined time. The C/N ratio calculator calculates a C/N ratio by using the average and the time variation range.

According to the present disclosure, a C/N ratio of a received signal of an FM broadcast can be accurately calculated.

BRIEF DESCRIPTION OF DRAWINGS

FIG. 7 is a diagram for use in explaining a process of correcting a time variation range in the second exemplary embodiment.

FIG. 15 is a diagram for use in explaining a determination process and a switching process in the third exemplary embodiment.

DESCRIPTION OF EMBODIMENTS

Prior to describing exemplary embodiments of the present invention, problems found in a conventional technique will now briefly be described herein.

The method disclosed in Patent Literature 1 is based on the assumption that a radio system employs a digital modulation. In this method, a constellation symbol is determined by a synchronous detection. Thus, the method cannot be applied to a radio system that employs an analog modulation and receives an FM radio broadcast.

In the method disclosed in Patent Literature 2, a signal that falls outside the signal bandwidth on the high frequency side is extracted from a baseband signal through a bandpass filter and is subjected to an FM demodulation. Then, the resultant signal is used as a noise voltage (a noise component). When a signal of an FM radio broadcast is received, however, a high level of an interfering signal may be present at a channel adjacent to the reception channel (namely, outside the signal bandwidth). Thus, the method disclosed in Patent Literature 2 in which a signal voltage outside the bandwidth of the reception channel is used as a noise component may have difficulty in accurately measuring a C/N ratio.

[How an Aspect of the Present Disclosure Came About]

Prior to the explanation of some exemplary embodiments of the present disclosure, experiments that have been conducted by the inventor of the present invention will be described.

Figure 1:
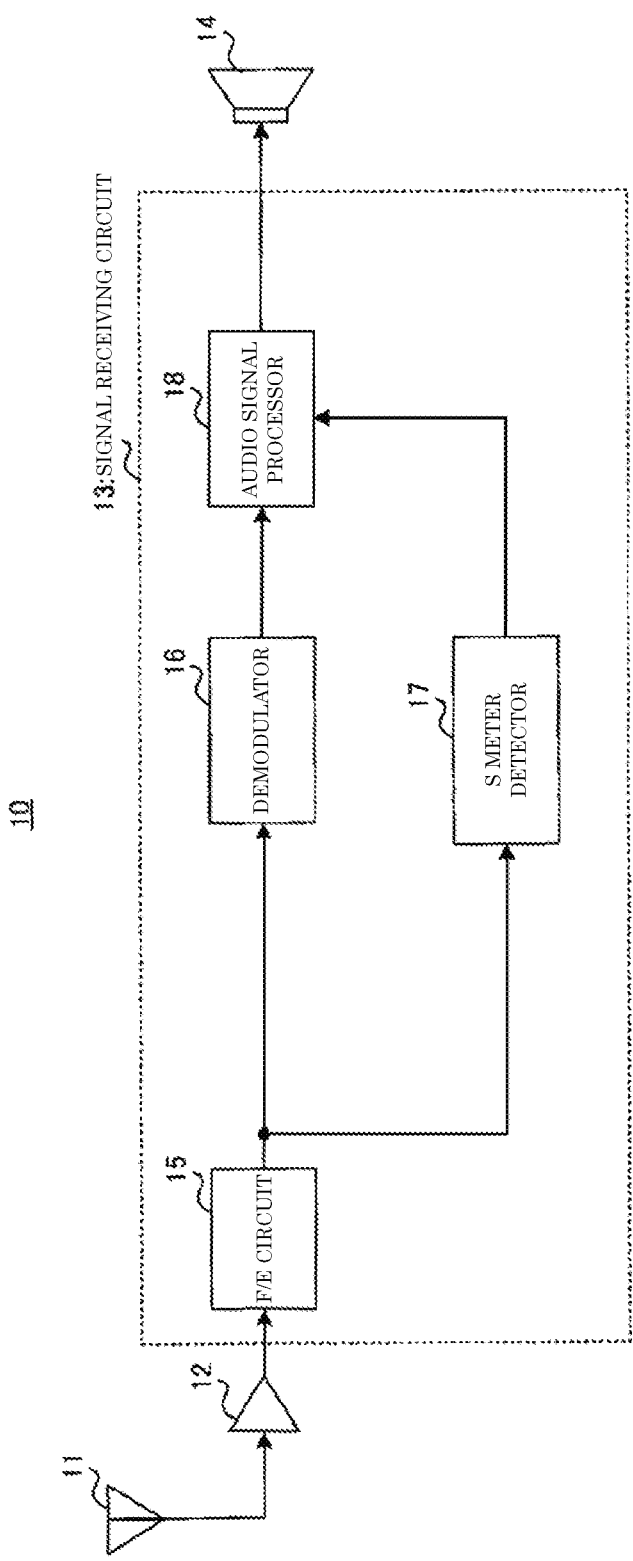
FIG. 1 is a block diagram illustrating a configuration of a radio receiver studied by the inventor of the present invention.

FIG. 1 is a block diagram illustrating an example of a configuration of a radio receiver that has been studied by the inventor of the present invention. In radio receiver 10, antenna 11 receives a radio signal, which then is input to antenna amplifier 12. Antenna amplifier 12 outputs a signal, which then is input to signal receiving circuit 13. Signal receiving circuit 13 outputs an audio signal, which is an output resulting from an audio signal process, to speaker 14. With this configuration, radio receiver 10 receives a radio signal of an FM radio broadcast, and then speaker 14 outputs the sound of the broadcast content.

In signal receiving circuit 13, front-end (F/E) circuit 15 amplifies the radio signal output from antenna amplifier 12 and subjects the radio signal to a frequency conversion and filtering using a bandpass filter, for example, as appropriate. Finally, F/E circuit 15 outputs a signal having a frequency of a reception channel, namely, an FM signal at the reception channel to both demodulator 16 and S meter detector 17.

Demodulator 16 FM-demodulates the signal input from F/E circuit 15 and then outputs the resultant audio signal to audio signal processor 18.

S meter detector 17 calculates an S meter, based on the signal input from F/E circuit 15 and then outputs the calculated S meter to audio signal processor 18.

Audio signal processor 18 applies audio signal processes to the audio signal input from demodulator 16, in accordance with the S meter input from S meter detector 17. Examples of such audio signal processes include a muting process for decreasing a voltage of the audio signal and a high-frequency-component cutoff process for decreasing only voltages of high-frequency components in the audio signal. That is, audio signal processor 18 utilizes the S meter as an operating point for the audio signal processes, namely, a criterion for determining whether to perform the audio signal processes.

Next, a result of a confirmatory experiment conducted by the inventor of the present invention in a laboratory will be described, with reference to FIGS. 2 and 3.

Figure 2:
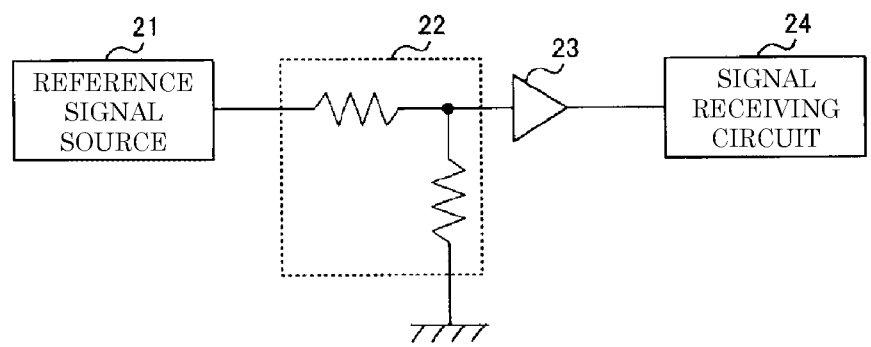
FIG. 2 is a block diagram illustrating a measurement system that measures a voltage of a radio signal in a signal receiving circuit.

FIG. 2 is a diagram illustrating measurement system 20 used to measure a voltage of a radio signal, which is equivalent to a reception environment of radio receiver 10 illustrated in FIG. 1. Measurement system 20 includes reference signal source 21, antenna dummy circuit 22, antenna amplifier 23, and signal receiving circuit 24. In measurement system 20, an output of reference signal source 21 is connected to an input section of antenna dummy circuit 22. An output of antenna dummy circuit 22 is connected to an input section of antenna amplifier 23. An output of antenna amplifier 23 is connected to an input section of signal receiving circuit 24.

Antenna amplifier 23 corresponds to antenna amplifier 12 illustrated in FIG. 1, and signal receiving circuit 24 corresponds to signal receiving circuit 13 illustrated in FIG. 1.

Figure 3:
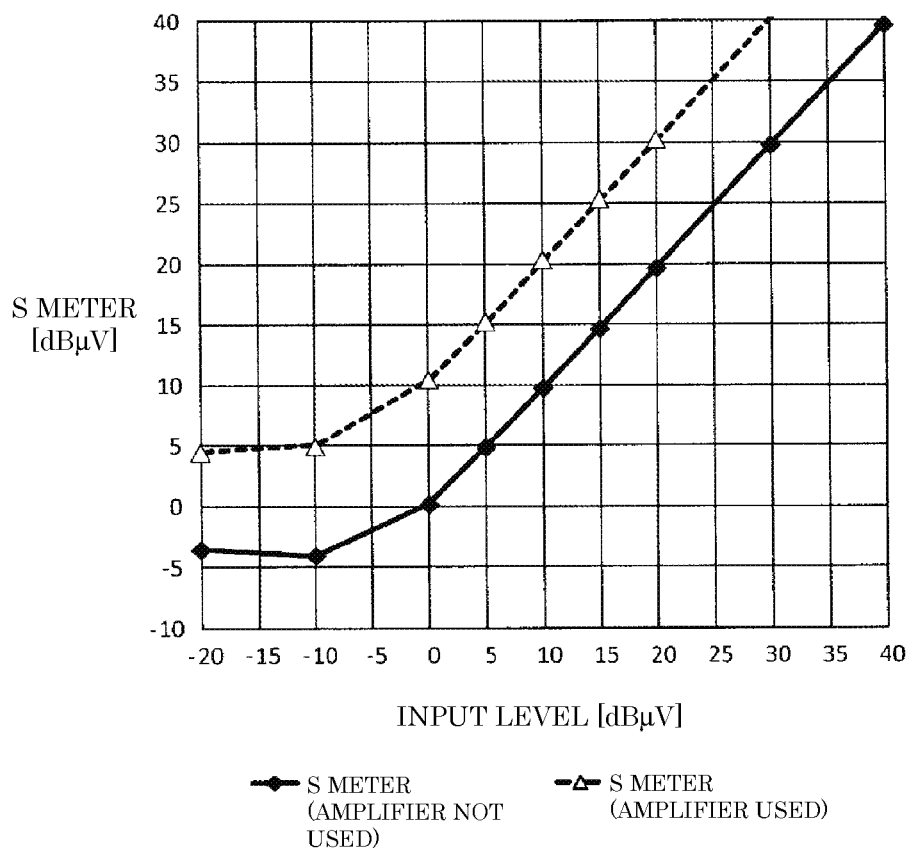
FIG. 3 is a diagram illustrating a result of measuring an S meter in the radio receiver studied by the inventor of the present invention.

FIG. 3 illustrates a measuring result in which signal receiving circuit 24 measures a voltage of a radio signal, namely, an S meter thereof. More specifically, for the purpose of the comparison, FIG. 3 illustrates results of measuring S meters in cases where an antenna amplifier is used and where no antenna amplifier is used. The latter case is equivalent to the simulation of the case where a rod antenna is used.

In FIG. 3, a gain of antenna amplifier 23 is set to 10 dB. Therefore, as illustrated in FIG. 3, at the same input level, the S meter obtained when the antenna amplifier is used is about 10 dB greater than the S meter obtained when no antenna amplifier is used.

Moreover, as illustrated in FIG. 3, when the input level, which corresponds to the output voltage of antenna dummy circuit 22 in FIG. 2, is about −20 dBμV, the S meter with no antenna amplifier decreases to −3 dBμV, whereas the S meter with the antenna amplifier decreases to only 5 dBμV.

As can be seen from the above result, if an S meter is used as a criterion for determining whether to perform audio signal processes, such as the muting process and the high-frequency-component cutoff process, the input level at which the audio signal processes are performed varies depending on the presence or absence of the antenna amplifier.

As an example, suppose a software program for the audio signal processes is configured such that the audio signal processes are performed when the S meter in FIG. 3 is equal to or less than 8 dBμV. When no antenna amplifier is used, the audio signal processes are performed at the input level equal to or less than 8 dBμV. However, when the antenna amplifier is used, the audio signal processes are performed at the input level equal to or less than −5 dBμV. In short, the input level at which the audio signal processes are performed is displaced depending on the presence or absence of the antenna amplifier.

As another example, suppose the software program for the audio signal processes is configured such that the audio signal processes are performed when the S meter in FIG. 3 is equal to or less than 0 dBμV. When no antenna amplifier is used, the audio signal processes are performed at the input level equal to or less than 0 dBμV. However, when the antenna amplifier is used, the audio signal processes are not performed, because the S meter does not decrease to 0 dBμV.

As described above, if an S meter, which is an index purely indicating a voltage of the radio signal, is used, audio signal processes are not performed under a weak electric field environment when an antenna amplifier is used, as opposed to when no antenna amplifier is used.

In some exemplary embodiments of the present disclosure, methods for controlling the audio signal processes with a C/N ratio will be described. With these methods, the audio signal processes are performed under a weak electric field environment even when an antenna amplifier is used, similarly to the case where no antenna amplifier is used. In addition, the invention according to an aspect of the present disclosure aims to accurately calculate a C/N ratio of a radio signal modulated with an FM or other analog modulation scheme.

Some exemplary embodiments according to an aspect of the present disclosure will be described below with reference to the accompanying drawings.

First Exemplary Embodiment

[Configuration of Radio Receiver]

Figure 4:
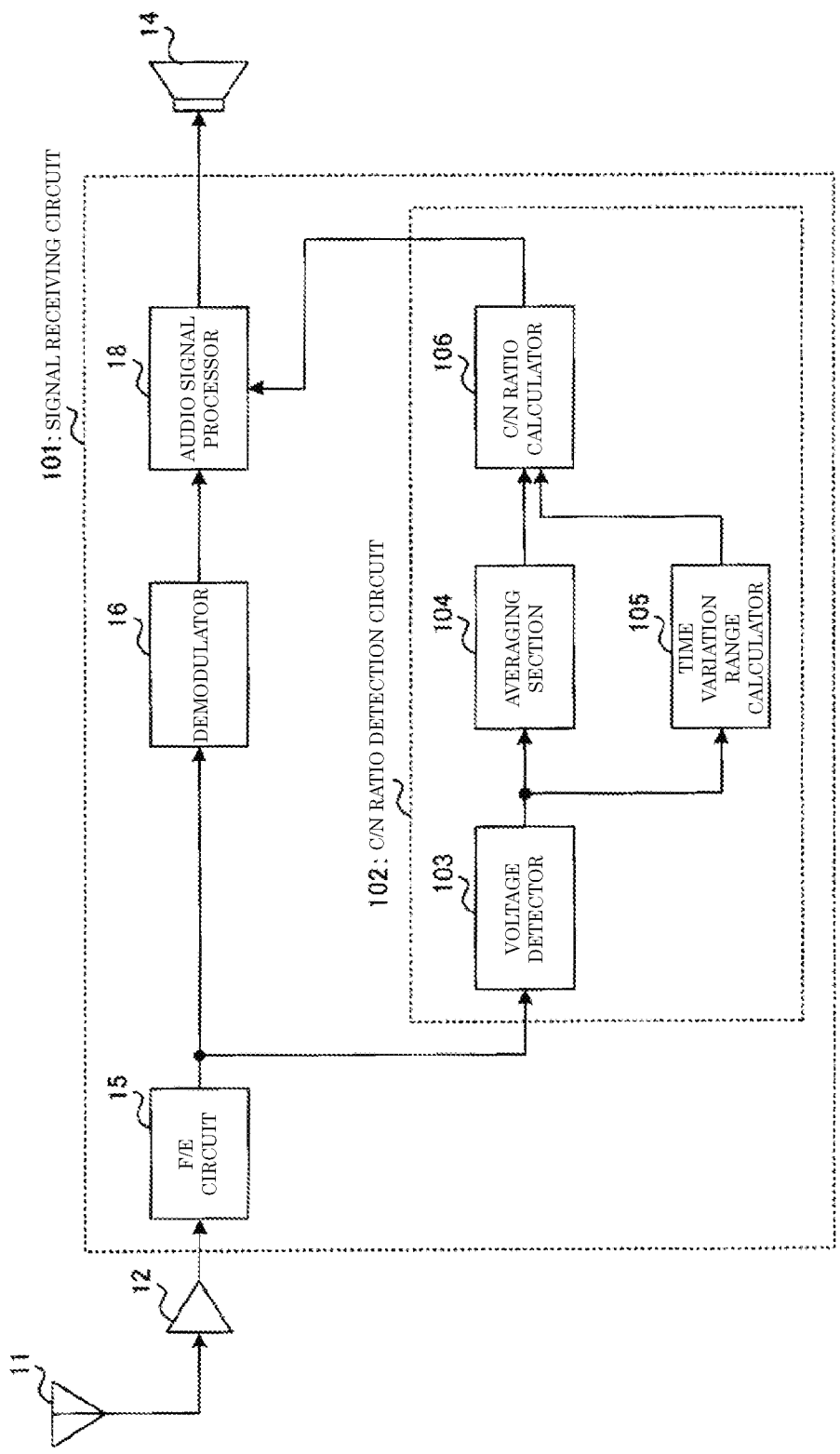
FIG. 4 is a block diagram illustrating a configuration of a radio receiver according to a first exemplary embodiment.

FIG. 4 is a block diagram illustrating a configuration of a radio receiver according to the first exemplary embodiment. It should be noted that constituent elements in FIG. 4 which are substantially identical to constituent elements of radio receiver 10 in FIG. 1 are denoted by identical reference numerals and will not be described.

In FIG. 4, radio receiver 100 includes antenna 11, antenna amplifier 12, signal receiving circuit 101, and speaker 14.

In radio receiver 100, antenna 11 receives a radio signal, which then is input to antenna amplifier 12. Antenna amplifier 12 outputs a signal, which then is input to signal receiving circuit 101. Signal receiving circuit 101 outputs an audio signal, which is an output resulting from an audio signal process, to speaker 14. With this configuration, radio receiver 100 receives a radio signal of an FM radio broadcast, and then speaker 14 outputs the sound of the broadcast content.

[Configuration of Signal Receiving Circuit]

Signal receiving circuit 101 includes F/E circuit 15, demodulator 16, C/N ratio detection circuit 102, and audio signal processor 18.

C/N ratio detection circuit 102 calculates a C/N ratio of a signal input from F/E circuit 15 and then outputs the calculated C/N ratio to audio signal processor 18.

Audio signal processor 18 applies audio signal processes to the audio signal received from demodulator 16, in accordance with the C/N ratio input from C/N ratio detection circuit 102. Examples of such audio signal processes include a muting process for decreasing a voltage of the audio signal input from demodulator 16 and a high-frequency-component cutoff process for decreasing only voltages of high-frequency components in the audio signal. Specifically, audio signal processor 18 uses the C/N ratio input from C/N ratio detection circuit 102 as an operating point for the audio signal processes.

[Configuration of C/N Ratio Detection Circuit]

C/N ratio detection circuit 102 includes voltage detector 103, averaging section 104, time variation range calculator 105, and C/N ratio calculator 106.

C/N ratio detection circuit 102 receives a signal output from F/E circuit 15 and then outputs a C/N ratio as a calculation result to audio signal processor 18.

In C/N ratio detection circuit 102, voltage detector 103 measures an input voltage and then outputs the measured input voltage to both averaging section 104 and time variation range calculator 105.

It should be noted that the input voltage obtained in voltage detector 103 may be a value according to the intensity of a received signal and thus is not limited to a voltage at a specific point in signal receiving circuit 101. In addition, the input voltage of the received signal may be a value obtained by calculating the measured voltage. As an example, a value determined in the following manner may be used as the input voltage of the received signal in the first exemplary embodiment.

Specifically, the input voltage may be either a voltage of a baseband signal at the last stage of F/E circuit 15 in signal receiving circuit 101 or a voltage of a radio signal at the first stage of F/E circuit 15. For example, a voltage, or an S meter, of the radio signal may be calculated as a value obtained by subjecting a voltage of the baseband signal to a back calculation using a gain or a loss of the process performed by F/E circuit 15 (e.g., a gain or a loss of a low noise amplifier (LNA)). In short, in the first exemplary embodiment, voltage detector 103 calculates an S meter as the input voltage.

Averaging section 104 determines an average of a voltage, or an S meter, that has been input from voltage detector 103 over predetermined time T0 to calculate average S_ave of the S meter over predetermined time T0. Averaging section 104, then, outputs calculated average S_ave of the S meter to C/N ratio calculator 106.

Time variation range calculator 105 calculates time variation range S_dev of the input voltage, or the S meter, that has been input from voltage detector 103 over predetermined time T0. Time variation range calculator 105, then, outputs calculated time variation range S_dev of the S meter to C/N ratio calculator 106.

C/N ratio calculator 106 calculates a C/N ratio by using average S_ave of the S meter input from averaging section 104 and time variation range S_dev of the S meter input from time variation range calculator 105. For example, as expressed by equation (1), C/N ratio calculator 106 may calculate, as the C/N ratio (expressed by C/N [dB]), the ratio of the square of average S_ave of the S meter to the product of constant N and the square of time variation range S_dev of the S meter. In equation (1), units of average S_ave and time variation range S_dev are expressed in volts.

$$C/N[\text{dB}] = 10 \times \log\left[\frac{(S\_ave)^2}{N \times (S\_dev)^2}\right] \quad (1)$$

In equation (1), N represents any constant that depends on a method for calculating time variation range S_dev of an S meter. As an example, if time variation range S_dev of an S meter is obtained as the standard deviation, coefficient N may be set to 2. As another example, when time variation range S_dev of an S meter is obtained as a difference between maximum S_max and minimum S_min (S_max−S_min) of the S meter, coefficient N is set to about ½.

For example, when coefficient N is 2 and the standard deviation of a time variation in an S meter, which is referred to below as the "standard deviation of an S meter" for the sake of convenience, is denoted by S_devst, a C/N ratio may be expressed by equation (2), instead of equation (1).

$$C/N[\text{dB}] = 10 \times \log\left[\frac{(S\_ave)^2}{2 \times (S\_devst)^2}\right] \quad (2)$$

The reason why a C/N ratio can be calculated using equation (2) is that the energy of noise can be obtained as a time variation range of an S meter.

More specifically, assuming that a time variation in an S meter is normally distributed with respect to a voltage, average energy of the noise is proportional to 2× (the square of the standard deviation of the S meter). The reason why the square of standard deviation S_devst of the S meter is multiplied by coefficient N (=2) in equation (2) is that the standard deviation represents the average of a variation in the population of a normal distribution on one of the upper and lower sides. In short, noise power on the increasing side of the S meter and noise power on the decreasing side of the S meter are both proportional to the square of the standard deviation of the S meter and are equal to each other. Thus, the total power of the noise corresponds to the sum of the powers on the increasing side of the S meter and the power in the decreasing side. Therefore, the total power of the noise is obtained by multiplying the square of the standard deviation of the S meter by coefficient N (=2), (reference: Yoshio KARASAWA, "Basic of radio wave propagation in digital mobile communication" CORONA PUBLISHING CO., LTD.).

Time variation range calculator 105 calculates the standard deviation more accurately as calculation time T0 is set to a larger value. In addition, if a radio receiver is used as a vehicle radio, it is necessary to regard the calculation of the C/N ratio in response to a variation in ambient electric field, as an important factor. Moreover, when the calculation is made through a digital process, calculation accuracy depends on the number of data samples. The inventor of the present invention has got an evaluation result in which, when 30 or more data samples are used, the probability that a calculation error of a C/N ratio becomes equal to or more than 2 dB falls within 10%.

Although the calculation time changes with a sampling rate, if the sampling rate is set to 30×1000 sample/second, namely, if a sampling frequency is set to 30 kHz or more, the calculation can be made in 1 ms or less. Therefore, in consideration of both the response to a variation in an electric field and calculation accuracy, calculation time T0 for averaging section 104 and time variation range calculator 105 is preferably set to 1 ms or less.

[Characteristics of C/N Ratio Detection Circuit]

Characteristics of C/N ratio detection circuit 102 configured above will be described.

Figure 5:
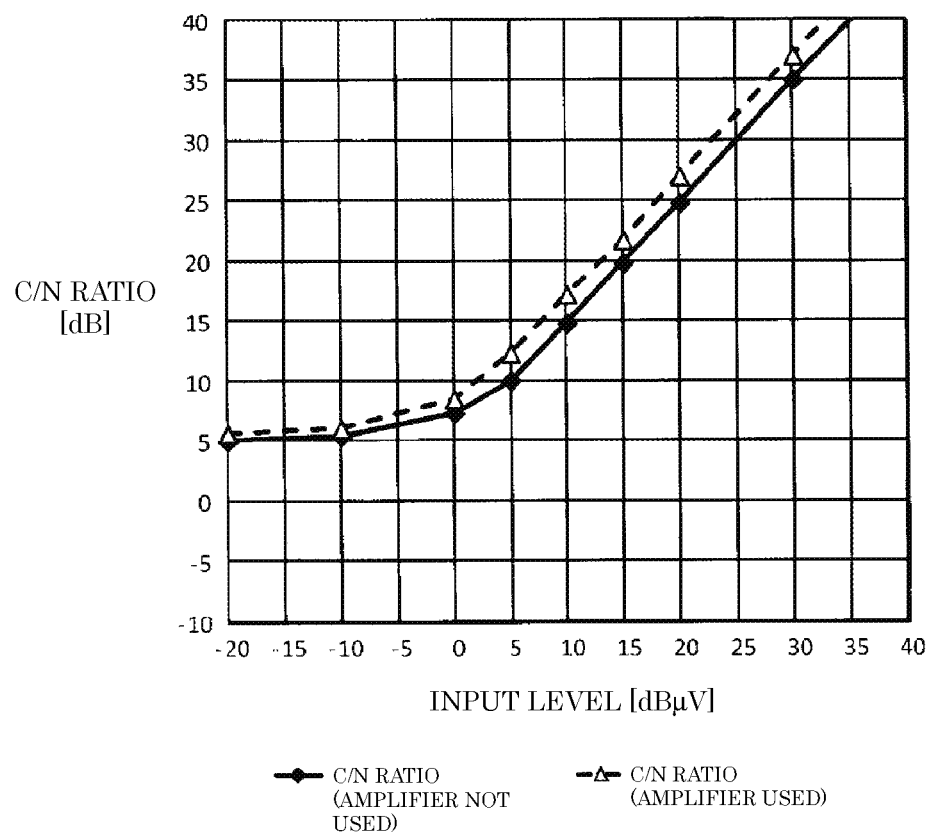
FIG. 5 is a diagram illustrating a result of measuring a C/N ratio in the first exemplary embodiment.

FIG. 5 illustrates a measuring result in which C/N ratio detection circuit 102 according to the first exemplary embodiment measures a C/N ratio. More specifically, FIG. 5 illustrates C/N ratios obtained when antenna amplifier 12 is used and when antenna amplifier 12 is not used. In this case, the gain of antenna amplifier 12 is set to 10 dB.

The measurement result illustrated in FIG. 5 was obtained by the inventor of the present invention under the condition that C/N ratio detection circuit 102 was mounted in a vehicle radio tuner. In this case, voltage detector 103 was provided in a baseband signal section, and C/N ratio detection circuit 102 was implemented using microcode.

It can be seen from FIG. 5, the C/N ratios obtained when an antenna amplifier is used and when no antenna amplifier is used substantially coincide with each other over the range from 5 dB to 40 dB both inclusive. In short, C/N ratio detection circuit 102 calculates approximately identical C/N ratios at an identical input level, independently of the use of an antenna amplifier.

As described above, the radio receiver of FIG. 3 may perform different audio signal processes, depending on the presence or absence of an antenna amplifier, because the S meter obtained when an antenna amplifier is used differs from the S meter obtained when no antenna amplifier is used. In contrast, audio signal processor 18 in the first exemplary embodiment is capable of performing audio signal processes independently of the presence or absence of an antenna amplifier. In other words, when no antenna amplifier is used, audio signal processor 18 performs the audio signal processes equivalently to when no antenna amplifier is used. This is because audio signal processor 18 uses the C/N ratio in FIG. 5 as an operating point for the audio signal processes.

In the first exemplary embodiment, as described above, C/N ratio detection circuit 102 calculates a C/N ratio of a received signal by using the average and time variation range of an input voltage of the received signal.

In short, C/N ratio detection circuit 102 calculates a C/N ratio by using an input voltage of a received signal. As a result, in the first exemplary embodiment, a C/N ratio can be obtained independently of a modulation scheme, namely, regardless of whether an analog or digital modulation is employed.

In the first exemplary embodiment, C/N ratio detection circuit 102 calculates a C/N ratio by using a received signal at a reception channel. Therefore, C/N ratio detection circuit 102 can measure a C/N ratio without extracting noise components at channels other than the reception channel of an FM radio broadcast, as opposed to the method disclosed in Patent Literature 2. The first exemplary embodiment thereby makes it possible to accurately measure the C/N ratio at the reception channel.

According to the foregoing first exemplary embodiment, thus, a C/N ratio of a received signal of an FM broadcast can be accurately calculated.

According to the first exemplary embodiment, signal receiving circuit 101 can perform audio signal processes by using the C/N ratio calculated by C/N ratio detection circuit 102. When antenna amplifier 12 is used, this makes it possible to appropriately perform the audio signal processes in a weak electric field similarly to the case where antenna amplifier 12 is not used.

As illustrated in FIG. 5, signal receiving circuit 101 can perform audio signal processes by using substantially identical C/N ratio related to an identical input level, independently of the use of an antenna amplifier. Therefore, the first exemplary embodiment makes it possible to avoid performing a complicated process, such as a process for adjusting an operating point for audio signal processes in accordance with the gain of an antenna amplifier.

In the first exemplary embodiment, signal receiving circuit 101 performs audio signal processes by using a C/N ratio that indicates the quality of a received signal instead of an input voltage, such as an S meter. This makes it possible to detect a state in which noise emitted from some electric components in a vehicle or disturbing electromagnetic wave emitted from the outside of the vehicle causes an increase in a noise voltage. In accordance with a C/N ratio that reflects this increased noise voltage, signal receiving circuit 101 can perform audio signal processes, such as muting and high-frequency-component cutoff processes, appropriately. Consequently, radio receiver 100 can reduce strangeness of sound output from speaker 14.

The first exemplary embodiment has been described regarding the exemplary case where C/N ratio detection circuit 102 is provided in a digital circuit that handles a baseband signal. Alternatively, C/N ratio detection circuit 102 may be provided in a radio frequency (RF) analog circuit that handles an intermediate frequency signal or a radio signal. In this case, averaging section 104 and time variation range calculator 105 may be implemented using a low pass filter (LPF) or a peak hold circuit.

Second Exemplary Embodiment

[Configuration of Radio Receiver]

Figure 6:
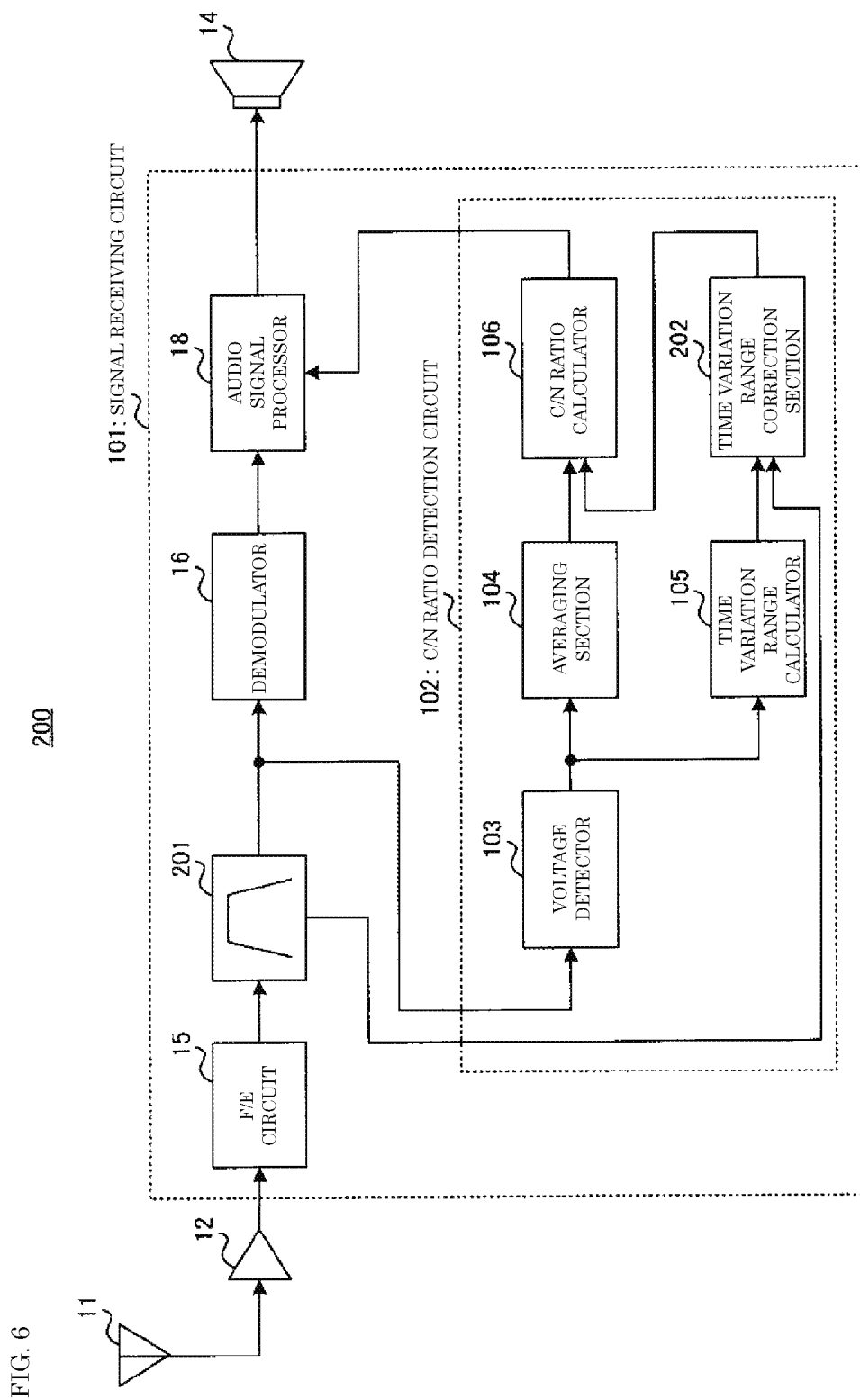
FIG. 6 is a block diagram illustrating a configuration of a radio receiver according to a second exemplary embodiment.

FIG. 6 is a block diagram illustrating a configuration of radio receiver 200 according to a second exemplary embodiment. It should be noted that constituent elements in FIG. 6 which are substantially identical to constituent elements in the first exemplary embodiment in FIG. 4 are denoted by identical reference numerals and will not be described in detail.

The second exemplary embodiment differs from the first exemplary embodiment in that bandpass filter 201 is provided between F/E circuit 15 and demodulator 16 and time variation range correction section 202 is provided in C/N ratio detection circuit 102.

In signal receiving circuit 101 of radio receiver 200, bandpass filter 201 extracts only a signal in a frequency band to be received or at a reception channel from an FM signal received from F/E circuit 15. Then, bandpass filter 201 selectively outputs the extracted signal to demodulator 16 and C/N ratio detection circuit 102. In parallel with this, bandpass filter 201 outputs the set bandwidth BPF_bw to time variation range correction section 202 in C/N ratio detection circuit 102.

Voltage detector 103 is electrically connected to an output terminal of bandpass filter 201 in C/N ratio detection circuit 102. Voltage detector 103 measures a voltage output from bandpass filter 201 and converts this voltage to an S meter similarly to the first exemplary embodiment. In the second exemplary embodiment, the S meter calculated by voltage detector 103 is an input voltage similarly to the first exemplary embodiment.

Time variation range correction section 202 corrects time variation range S_dev or standard deviation S_devst of the S meter input from time variation range calculator 105, in accordance with bandwidth BPF_bw input from bandpass filter 201. Then, time variation range correction section 202 outputs corrected time variation range S_dev_cor or corrected standard deviation S_devst_cor of the S meter to C/N ratio calculator 106. More specifically, when time variation range S_dev of the S meter is less than a reference value (referred to below as noise level reference value N_lv) set in accordance with bandwidth BPF_bw, time variation range correction section 202 corrects time variation range S_dev of the S meter so that time variation range S_dev becomes noise level reference value N_lv.

C/N ratio calculator 106 calculates a C/N ratio by using average S_ave input from averaging section 104 and corrected time variation range S_dev_cor (or corrected standard deviation S_devst_cor of the S meter) input from time variation range correction section 202. More specifically, C/N ratio calculator 106 replaces time variation range S_dev of the S meter in equation (1) with corrected time variation range S_dev_cor of the S meter. Alternatively, C/N ratio calculator 106 may replace standard deviation S_devst of the S meter in equation (2) with corrected standard deviation S_devst_cor of the S meter.

[Process for Correcting Time Variation Range]

Noise level reference value N_lv related to bandwidth BPF_bw of bandpass filter 201 is preset in time variation range correction section 202.

Then, time variation range correction section 202 compares the magnitudes of time variation range S_dev of the S meter input from time variation range calculator 105 and noise level reference value N_lv. FIG. 7 illustrates a result of the comparison between time variation range S_dev and reference value N_lv and an output value based on the comparison result, in time variation range correction section 202.

When time variation range S_dev of the S meter is equal to more than noise level reference value N_lv, time variation range correction section 202 outputs time variation range S_dev of the S meter that has undergone no correction (Case 1: no correction). If time variation range S_dev of the S meter is less than noise level reference value N_lv, time variation range correction section 202 outputs noise level reference value N_lv as corrected time variation range S_dev_cor of the S meter (Case 2: correction).

The correction of the time variation range of the S meter in time variation range correction section 202 aims to extend a measurement range of a C/N ratio to a region of a low C/N ratio (a low C/N ratio range).

Specifically, since time variation range S_dev represents a noise voltage, in principle, time variation range S_dev of an input voltage (the S meter) does not become lower than a voltage that is determined by power (kTB) of thermal noise defined by bandwidth BPF_bw of bandpass filter 201 where k denotes a Boltzmann constant, T denotes an absolute temperature, and B denotes a bandwidth (BPF_bw).

Figure 8:
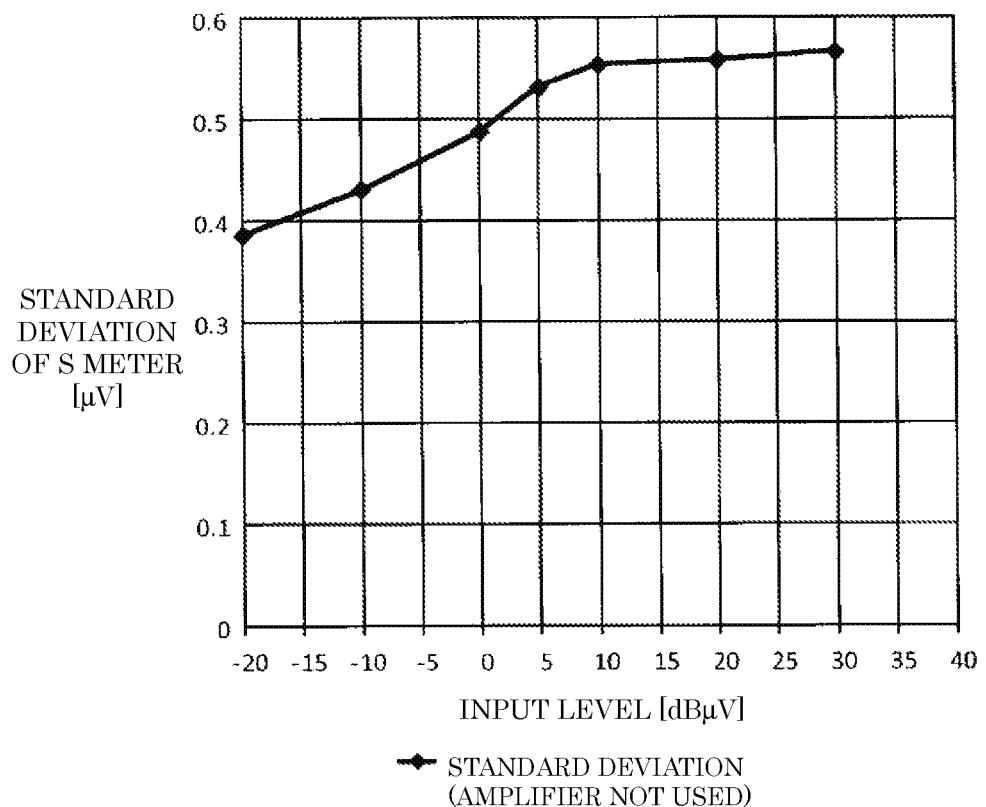
FIG. 8 is a diagram illustrating a result of measuring a standard deviation of an S meter in the second exemplary embodiment.

However, when a voltage of a radio signal to be received decreases so that a C/N ratio falls within the low C/N ratio region of 10 dB or less, time variation range S_dev of the S meter decreases. FIG. 8 illustrates a result of measuring an input level characteristic of standard deviation S_devst of an S meter.

The reason whey time variation range S_dev of an S meter decreases when a C/N ratio falls within the low C/N ratio range is that, when the S meter is close to a lower limit voltage (0V), the distribution of a time variation in the S meter deviates from the normal distribution. In this state, it is considered that time variation range S_dev of the S meter output from time variation range calculator 105 no longer indicates an actual noise level.

As time variation range S_dev of an S meter decreases, a C/N ratio in the low C/N ratio region is more than an actual value. Thus, a C/N ratio in the low C/N ratio region is calculated less accurately than the C/N ratio in any other region.

Therefore, time variation range correction section 202 presets noise level reference value N_lv as the lower limit of a voltage determined from power of thermal noise defined by bandwidth BPF_bw of bandpass filter 201. Then, time variation range correction section 202 uses noise level reference value N_lv as a threshold for determining whether time variation range S_dev of an S meter indicates an appropriate noise level. Further, when time variation range S_dev of an S meter is less than noise level reference value N_lv, time variation range correction section 202 determines that time variation range S_dev does not indicate an appropriate value. Then, time variation range correction section 202 outputs noise level reference value N_lv as corrected time variation range S_dev_cor of the S meter.

Figure 9:
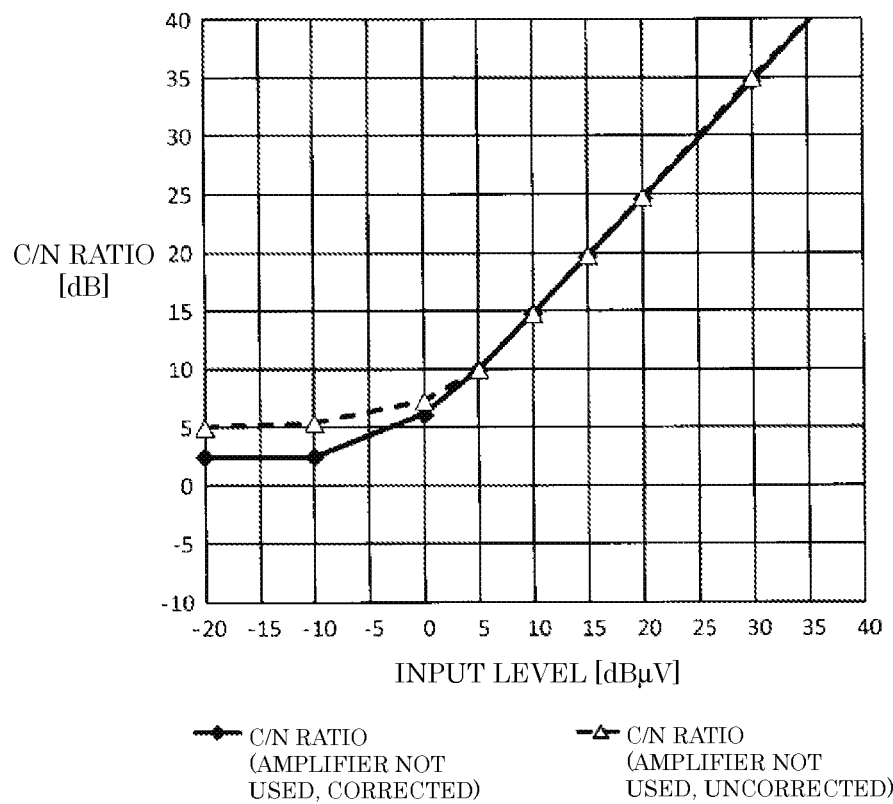
FIG. 9 is a diagram illustrating a result of measuring a C/N ratio in the second exemplary embodiment.

FIG. 9 illustrates a measuring result in which C/N ratio detection circuit 102 according to the second exemplary embodiment measures a C/N ratio. More specifically, FIG. 9 illustrates C/N ratios obtained when the time variation range of an S meter is corrected and when the time variation range of an S meter is not corrected. Further, the result in FIG. 9 is obtained under the condition of antenna amplifier 12 being not used.

As illustrated in FIG. 9, when the time variation range of an S meter is not corrected, a measurement of a C/N ratio decreases to only 5 dB in the low C/N ratio region, such as the region in which the C/N ratio is equal to or less than 10 dB. However, when the time variation range of an S meter is corrected, a measurement of a C/N ratio decreases to about 2 dB in the low C/N ratio region. In short, using a corrected time variation range of an S meter can specify an actual noise level more accurately than using an uncorrected time variation range of the S meter. As a result, a C/N ratio in a low C/N ratio range can be calculated more accurately.

In the second exemplary embodiment, as described above, time variation range correction section 202 corrects time variation range S_dev of an S meter, thereby improving calculation accuracy of the time variation range, or a noise level, of the S meter used to calculate a C/N ratio. This can extend a measurement range of a C/N ratio to a low C/N ratio range, and enables appropriately setting an operating point for audio signal processes in the low C/N ratio region.

The second exemplary embodiment makes it possible to calculate a C/N ratio of a received signal of an FM broadcast more accurately than the first exemplary embodiment.

In the second exemplary embodiment, signal receiving circuit 101 may include a plurality of bandpass filters 201 having different bandwidths. Bandpass filters 201 having different bandwidths may be selectively used in accordance with a reception state.

In the above case, time variation range correction section 202 may retain a table in which noise level reference values are related to the bandwidths of the plurality of bandpass filters 201. Then, the noise level reference value may be used in accordance with the bandwidth of bandpass filter 201 in use.

The above configuration enables C/N ratio detection circuit 102 to accurately detect a C/N ratio in a low C/N ratio region even when a reception bandwidth is narrowed or widened depending on the strength of an electric field or on the presence or absence of an interfering signal at an adjacent channel.

Third Exemplary Embodiment

Figure 10:
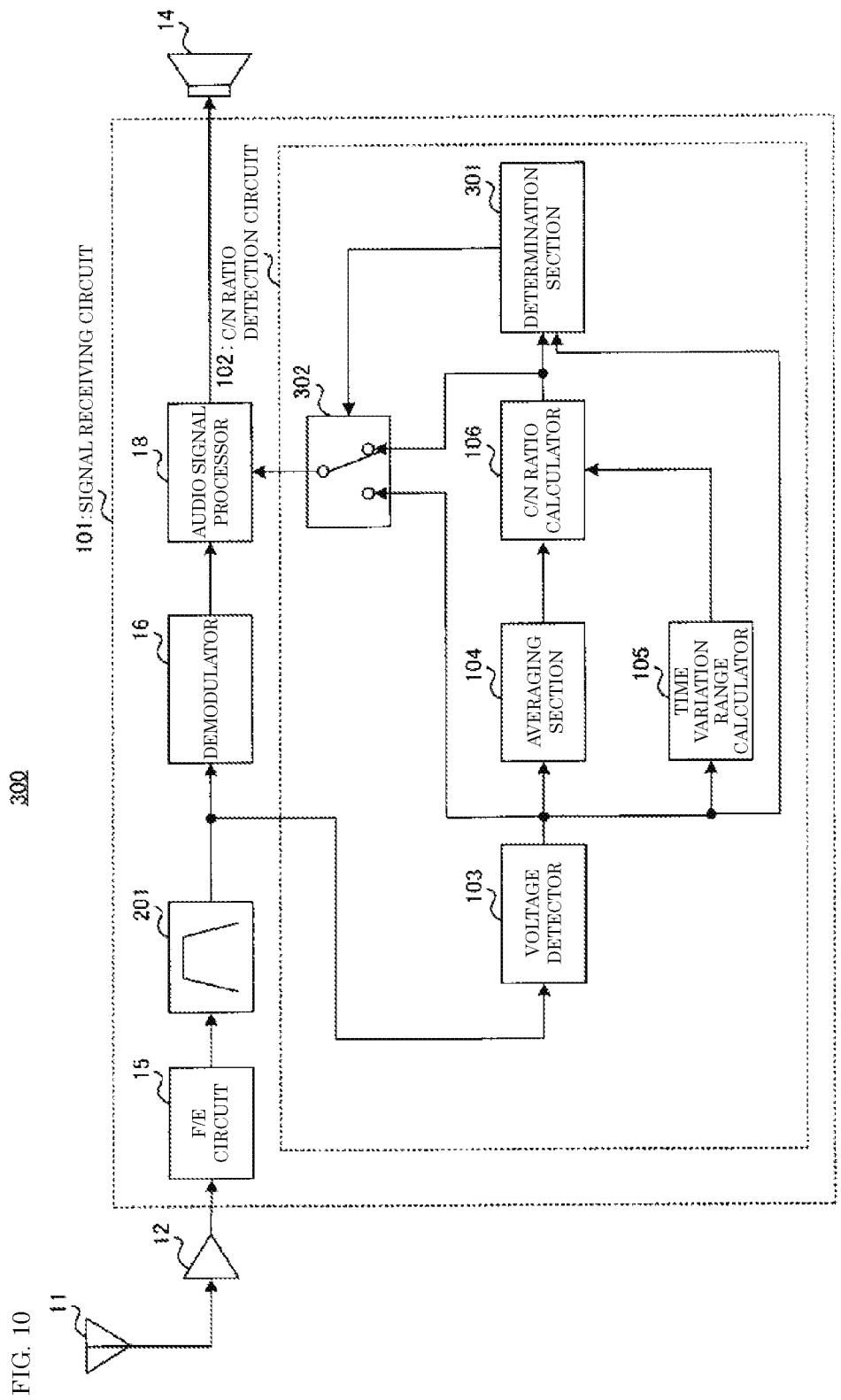
FIG. 10 is a block diagram illustrating a configuration of a radio receiver according to a third exemplary embodiment.

FIG. 10 is a block diagram illustrating a configuration of radio receiver 300 according to a third exemplary embodiment. It should be noted that constituent elements in FIG. 10 which are substantially identical to constituent elements in the first exemplary embodiment in FIG. 4 or the second exemplary embodiment in FIG. 6 are denoted by identical reference numerals and will not be described in detail.

The third exemplary embodiment differs from the first exemplary embodiment in that bandpass filter 201 is provided between F/E circuit 15 and demodulator 16 similarly to the second exemplary embodiment and in that determination section 301 and switch 302 are provided in C/N ratio detection circuit 102.

In C/N ratio detection circuit 102, voltage detector 103 converts a voltage output from bandpass filter 201 to an S meter, which is used as an input voltage, similarly to the second exemplary embodiment.

Determination section 301 compares the S meter input from voltage detector 103 with a C/N ratio input from C/N ratio calculator 106, and determines whether the bandwidth of bandpass filter 201 is narrower than an occupied bandwidth of the input signal. Then, determination section 301 outputs the determination result to switch 302.

Switch 302 is a switch having two inputs and one output. Switch 302 receives the S meter output from voltage detector 103 and the C/N ratio output from C/N ratio calculator 106. Switch 302 selects one from the S meter and the C/N ratio, based on the determination result of determination section 301 and then outputs the selected value to audio signal processor 18.

More specifically, when determination section 301 determines that the bandwidth of bandpass filter 201 is narrower than the occupied bandwidth of the input signal, switch 302 outputs the S meter. When determination section 301 determines that the bandwidth of bandpass filter 201 is not narrower than the occupied bandwidth of the input signal, switch 302 outputs the C/N ratio.

[Switching of Outputs of C/N Ratio Detection Circuit 102]

Next, an output switching process performed by determination section 301 and switch 302 will be described in detail.

If the bandwidth of bandpass filter 201 is narrower than the occupied bandwidth of the input signal, a part of the input signal is removed by bandpass filter 201. This may cause relatively large distortion of resultant sound. In addition, the partial removal of the input signal, which is caused by bandpass filter 201 whose bandwidth is narrower than the occupied bandwidth of the input signal, might hinder time variation range calculator 105 in C/N ratio detection circuit 102 from appropriately calculating a time variation range as a noise level.

Thus, if the bandwidth of bandpass filter 201 is narrower than the occupied bandwidth of the input signal, accuracy of a C/N ratio calculated by C/N ratio detection circuit 102 may be degraded.

A C/N ratio calculated when the bandwidth of bandpass filter 201 is narrower than the occupied bandwidth of the input signal will be described in detail below.

Since a signal received by radio receiver 300 is an FM signal, its carrier frequency varies with time. When the bandwidth of bandpass filter 201 is narrower than the occupied bandwidth of the input signal, the carrier frequency fluctuates while repeatedly escaping from or returning to the pass band of bandpass filter 201.

Therefore, when voltage detector 103 measures a voltage of a signal that has passed through bandpass filter 201, the voltage to be measured also decreases instantaneously. In this case, a voltage measured by voltage detector 103 is much lower than an actual voltage of the input signal, so that the time variation range of the input voltage, or the S meter, increases.

Herein, a state where the bandwidth of bandpass filter 201 is narrower than the occupied bandwidth of the input signal is a first state, and a state where the bandwidth of bandpass filter 201 is broader than the occupied bandwidth of the input signal is a second state or a normal state. Output S_dev of time variation range calculator 105 in the first state is greater than output S_dev in the second or normal state.

As a result, when the bandwidth of bandpass filter 201 is narrower than the occupied bandwidth of the input signal, a C/N ratio calculated by C/N ratio calculator 106 is much lower than a C/N ratio in the second or the normal state. In short, when the bandwidth of bandpass filter 201 is narrower than the occupied bandwidth of the input signal, a calculated C/N ratio does not indicate an accurate value and thus is unsuitable for use in controlling audio signal processes.

For this reason, when determination section 301 determines that the bandwidth of bandpass filter 201 is narrower than the occupied bandwidth of the input signal, determination section 301 outputs, to switch 302, a control signal containing an instruction to select the S meter, namely, the determination result. In response to this control signal, switch 302 performs a switching operation to output the S meter to audio signal processor 18.

When determination section 301 determines that the bandwidth of bandpass filter 201 is broader than the occupied bandwidth of the input signal, determination section 301 outputs, to switch 302, a control signal containing an instruction to select the C/N ratio, namely, the determination result. In response to this control signal, switch 302 performs a switching operation to output the C/N ratio to audio signal processor 18.

[Determination Process Performed by Determination Section 301]

Next, a method in which determination section 301 determines whether the bandwidth of bandpass filter 201 is narrower than the occupied bandwidth of the input signal will be described.

Figure 11:
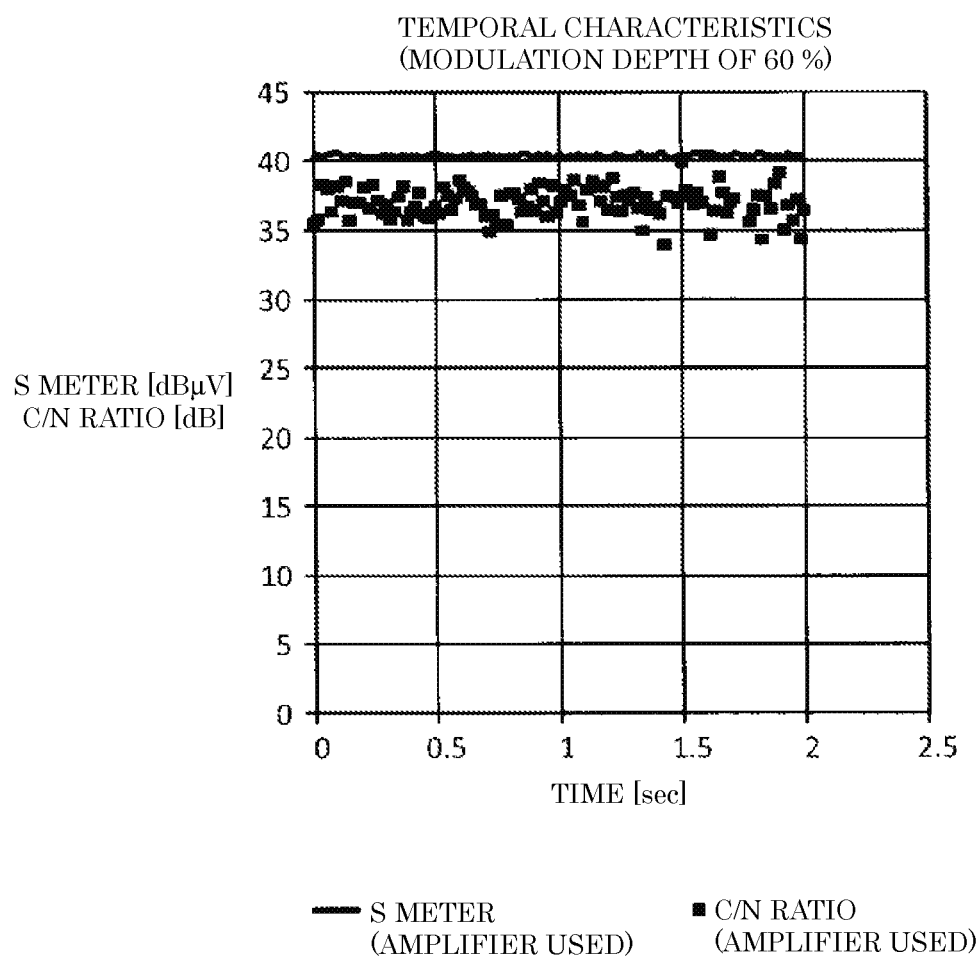
FIG. 11 is a diagram illustrating a result of measuring an S meter and a C/N ratio in the third exemplary embodiment when a signal with a percentage modulation of 60% is input.
Figure 12:
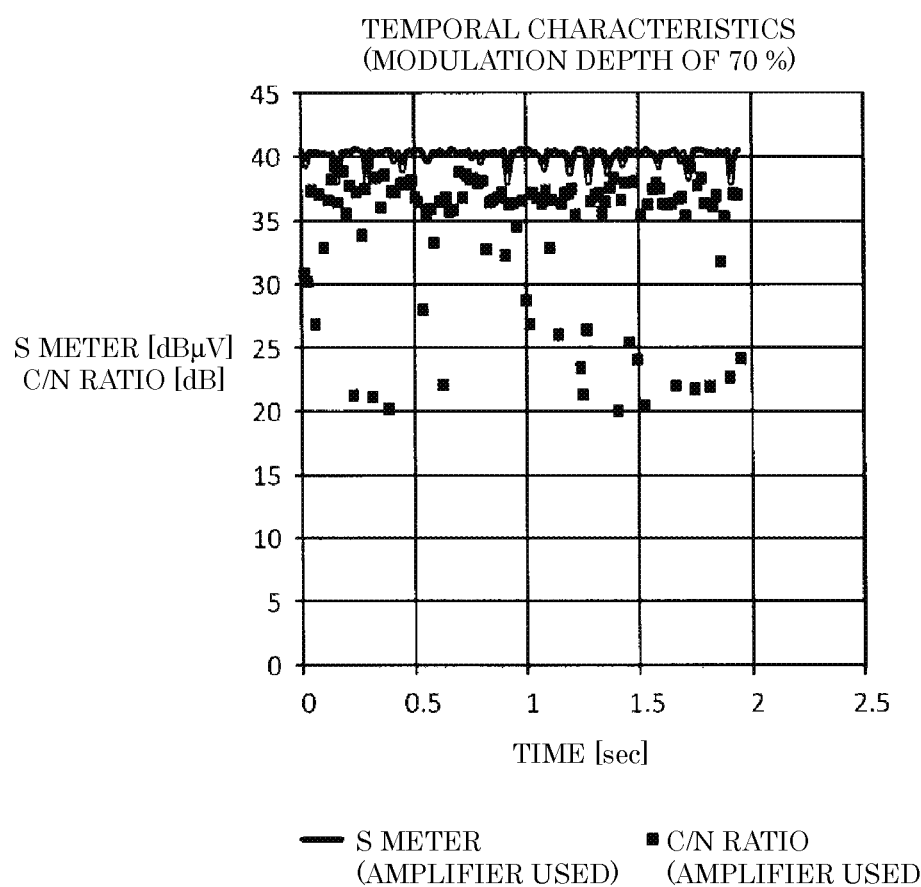
FIG. 12 is a diagram illustrating a result of measuring an S meter and a C/N ratio in the third exemplary embodiment when a signal with a percentage modulation of 70% is input.
Figure 13:
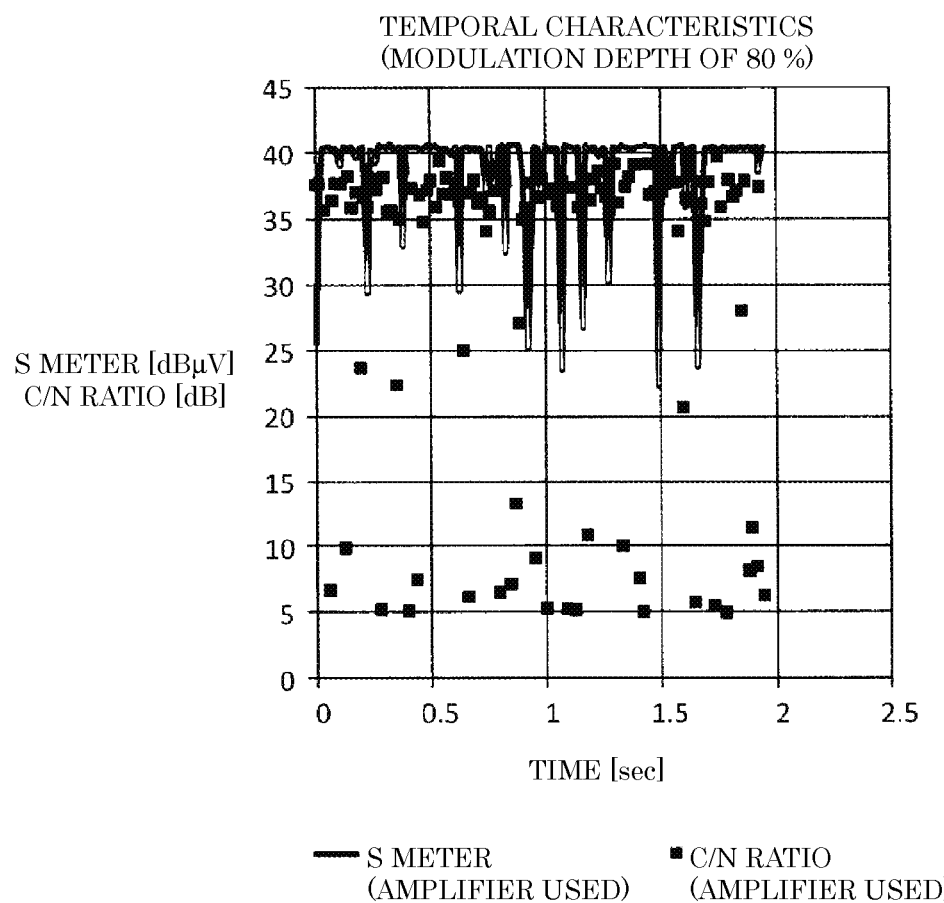
FIG. 13 is a diagram illustrating a result of measuring an S meter and a C/N ratio in the third exemplary embodiment when a signal with a percentage modulation of 80% is input.

FIGS. 11 to 13 each illustrate a result of measuring an S meter and a C/N ratio in the normal state, and the state in which the bandwidth of bandpass filter 201 is narrower than the occupied bandwidth of the input signal.

In general, occupied bandwidth B of an FM modulation signal can be expressed by the equation: $B=2\times(\Delta f+fp)$, where $\Delta f$ denotes a maximum frequency shift and fp denotes a modulation frequency. Further, occupied bandwidth B corresponds to bandwidth B required for bandpass filter 201.

For example, maximum frequency shift $\Delta f$ [kHz] of a signal of an FM radio broadcast can be expressed by 75 [kHz]×modulation percentage r, which is typically expressed as a percentage (%). For example, maximum frequency shift $\Delta f$ [kHz] of an FM modulation signal having modulation percentage r of 30% can be expressed by 75×0.3=22.5 kHz.

If an FM radio broadcast employs a monophonic modulation, maximum modulation frequency fp is 15 KHz, which is the maximum in an audio frequency bandwidth. If an FM radio broadcast employs a stereophonic modulation, maximum modulation frequency fp is 53 kHz (=pilot frequency (19 kHz)×2+ maximum frequency (15 kHz) of audio signal).

The data in FIGS. 11 to 13 was obtained under the condition of the bandwidth of bandpass filter 201 being set to 120 kHz. In FIGS. 11 to 13, received signals are subject to FM monophonic modulation at a modulation frequency fp of 1 kHz and modulation percentages of 60%, 70%, and 80%. More specifically, FIG. 11 illustrates temporal characteristics of an S meter and a C/N ratio at a modulation percentage of 60%, namely, in a normal state; FIG. 12 illustrates temporal characteristics of an S meter and a C/N ratio at a modulation percentage of 70%; and FIG. 13 illustrates temporal characteristics of an S meter and a C/N ratio at modulation a percentage of 80%.

Required bandwidth B at the modulation percentage of 60% (60%) is 92 [kHz] (=2×(45+1)); required bandwidth B at the modulation percentage of 70% (70%) is 107 [kHz] (=2×(52.5+1)); and required bandwidth B at the modulation percentage of 80% (80%) is 122 [kHz] (=2×(60+1)). FIGS. 11, 12 illustrate the normal state in which the bandwidth of bandpass filter 201 is broader than required bandwidth B; and FIG. 13 illustrates the state in which the bandwidth of bandpass filter 201 is narrower than required bandwidth B.

As illustrated in FIG. 11, the time variation in the C/N ratio at the modulation percentage of 60% (required bandwidth B=92 kHz) is about 6 dB, and the maximum difference between the C/N ratio and the S meter is about 6 dB.

As illustrated in FIG. 12, the time variation in the C/N ratio at the modulation percentage of 70% (required bandwidth B=107 kHz) instantly decreases to about 20 dB that is a minimum value. In FIG. 12, thus, the time variation in the C/N ratio is about 20 dB, and the maximum difference between the C/N ratio and the S meter is about 20 dB.

As illustrated in FIG. 13, the time variation in the C/N ratio at the modulation percentage of 80% (required bandwidth B=122 kHz) instantly decreases to about 5 dB that is a minimum value. In FIG. 13, thus, the time variation in the C/N ratio is about 35 dB, and the maximum difference between the C/N ratio and the S meter is about 35 dB.

As illustrated in FIGS. 11 to 13, an S meter varies with time also depending on a modulation percentage. However, it can be seen that the variation in the S meter is less prominent than the variation in the C/N ratio.

As illustrated in FIGS. 11 to 13, a variation in the temporal characteristics of the C/N ratios measured is greater than a variation in the temporal characteristics of the S meters measured, in accordance with magnitude between the bandwidth of bandpass filter 201 and the occupied bandwidth (the required bandwidth B) of the input signal. More specifically, when bandpass filter 201 has a fixed bandwidth, as the occupied bandwidth (the required bandwidth B) of the input signal increases, a variation in the C/N ratio, or the difference between the C/N ratio and the S meter, increases with time.

In light of the above temporal characteristic of a C/N ratio, determination section 301 determines whether the bandwidth of bandpass filter 201 is narrower than the occupied bandwidth of the input signal in accordance with whether a C/N ratio to be calculated falls within an expected range.

Hereinafter, the correspondence relationship between an S meter and a C/N ratio will be described.

Figure 14:
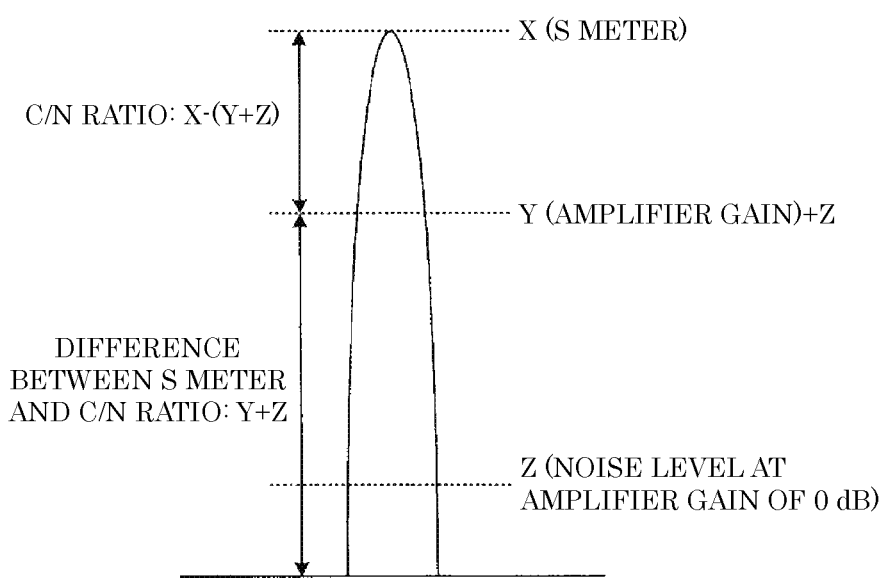
FIG. 14 is a diagram for use in explaining a correspondence relationship between an S meter and a C/N ratio in the third exemplary embodiment.

FIG. 14 illustrates the relationship between an S meter and a C/N ratio under the influence of an amplifier gain. As illustrated in FIG. 14, an S meter is denoted by X [dBµV]; the gain of antenna amplifier 12 is denoted by Y [dB]; and a noise level when antenna amplifier 12 is not used is denoted by Z [dBµV] in terms of an S meter. In this case, the noise level may be equivalent to a noise level when antenna amplifier 12 having no amplifier gain (0 [dB]) is used. In this case, noise level Z depends on the bandwidth of bandpass filter 201.

In FIG. 14, the noise level is equivalent to a noise level (Y+Z) [dBµV] obtained in a manner that noise level Z in the case where antenna amplifier 12 is not used is amplified by amplifier gain Y of antenna amplifier 12. In this case, the C/N ratio can be expressed by a ratio of S meter X to noise level (Y+Z), namely, X−(Y+Z) [dB].

The difference (X−(Y+Z)) between S meter X and the C/N ratio can be expressed by (Y+Z). In the normal state, thus, the difference between the S meter and the C/N ratio can be (Y+Z). In this case, when the difference between the S meter and the C/N ratio is equal to or more than (Y+Z), determination section 301 can determine that the C/N ratio indicates a small value, because the bandwidth of bandpass filter 201 is narrower than the occupied bandwidth of the input signal. In other words, by detecting whether the difference between the S meter and the C/N ratio is not more than the threshold (Y+Z) or exceeds the threshold (Y+Z), determination section 301 can determine whether the bandwidth of bandpass filter 201 is narrower than the occupied bandwidth of the input signal.

In FIG. 14, as an example, the case where X is set to 30 [dBµV], Y is set to 15 [dB], and Z is set to 5 [dBµV] will be described. In the normal state, the C/N ratio, which can be calculated from X−(Y+Z), is 10 [dB], and the difference between the S meter X and the C/N ratio is 20 [dB]. Thus, even when the C/N ratio becomes lower than 10 [dB] only instantly, namely, even when the difference between the S meter and the C/N ratio exceeds 20 [dB] only instantly, it can be determined that the bandwidth of bandpass filter 201 is no longer in the normal state and is narrower than the occupied bandwidth of the input signal and that, for this reason, the C/N ratio indicates a small value. In short, by detecting whether the difference between the S meter and the C/N ratio is not more than the threshold of 20 [dB] or exceeds the threshold of 20 [dB], determination section 301 can determine whether the bandwidth of bandpass filter 201 is narrower than the occupied bandwidth of the input signal.

Determination section 301 calculates a difference between an S meter and a C/N ratio. Then, based on whether the calculated difference falls within a range expected from the amplifier gain of antenna amplifier 12, determination section 301 determines whether the bandwidth of bandpass filter 201 is narrower than the occupied bandwidth of the input signal. More specifically, if the difference between the S meter and the C/N ratio exceeds a predetermined threshold, determination section 301 determines that the bandwidth of bandpass filter 201 is narrower than the occupied bandwidth of the input signal.

FIG. 15 illustrates: a result of comparing the difference between a C/N ratio and an S meter and a threshold in determination section 301, namely, a result of determining whether the difference between the C/N ratio and the S meter falls within the predetermined range; and the output of switch 302 based on the comparison result.

If the difference between the C/N ratio and the S meter falls within the predetermined range, determination section 301 determines that the bandwidth of bandpass filter 201 is not narrower than the occupied bandwidth of the input signal. In this case, switch 302 outputs the C/N ratio to audio signal processor 18. In short, if the difference between the C/N ratio and the S meter is equal to or less than a threshold, switch 302 outputs the C/N ratio (Case 3).

If the difference between the C/N ratio and the S meter falls outside the predetermined range, determination section 301 determines that the bandwidth of bandpass filter 201 is narrower than the occupied bandwidth of the input signal. In this case, switch 302 outputs the S meter to audio signal processor 18. In short, if the difference between the C/N ratio and the S meter is larger than the threshold, switch 302 outputs the S meter (Case 4).

In an actual case, however, the S meter fluctuates with time. Therefore, when comparing the S meter with the C/N ratio as illustrated in FIG. 15, determination section 301 needs to determine whether a value obtained by adding a margin to the difference between the S meter and the C/N ratio falls within the assumed range. In this case, the margin is determined in consideration of a time fluctuation. In FIG. 14, thus, determination section 301 may determine whether the difference between the S meter and the C/N ratio falls within the range of ((Y+Z)+(margin)). More specifically, determination section 301 may set the threshold used for the determination to ((Y+Z)+(margin)). For example, the margin may be set to 5 [dB] in consideration of the time fluctuation of the S meter.

According to the third exemplary embodiment, as described above, C/N ratio detection circuit 102 determines whether the bandwidth of bandpass filter 201 is narrower than the occupied bandwidth of the input signal. If the bandwidth of bandpass filter 201 is not narrower than the occupied bandwidth of the input signal, C/N ratio detection circuit 102 outputs a C/N ratio to audio signal processor 18, similarly to the first exemplary embodiment. If the bandwidth of bandpass filter 201 is narrower than the occupied bandwidth of the input signal, C/N ratio detection circuit 102 outputs an S meter to audio signal processor 18.

In this way, when the bandwidth of bandpass filter 201 is narrower than the occupied bandwidth of the input signal, C/N ratio detection circuit 102 avoids controlling audio signal processes using a degraded S meter. Instead, C/N ratio detection circuit 102 uses an S meter to perform audio signal processes with stability.

According to the third exemplary embodiment, radio receiver 300 includes determination section 301 and switch 302. This configuration enables C/N ratio detection circuit 102 to detect the state in which the bandwidth of bandpass filter 201 is narrower than the occupied bandwidth of the input signal, and thus can provide audio signal processor 18 with a value suitable for the detected state, as a value to be used for audio signal processes.

Figure 16:
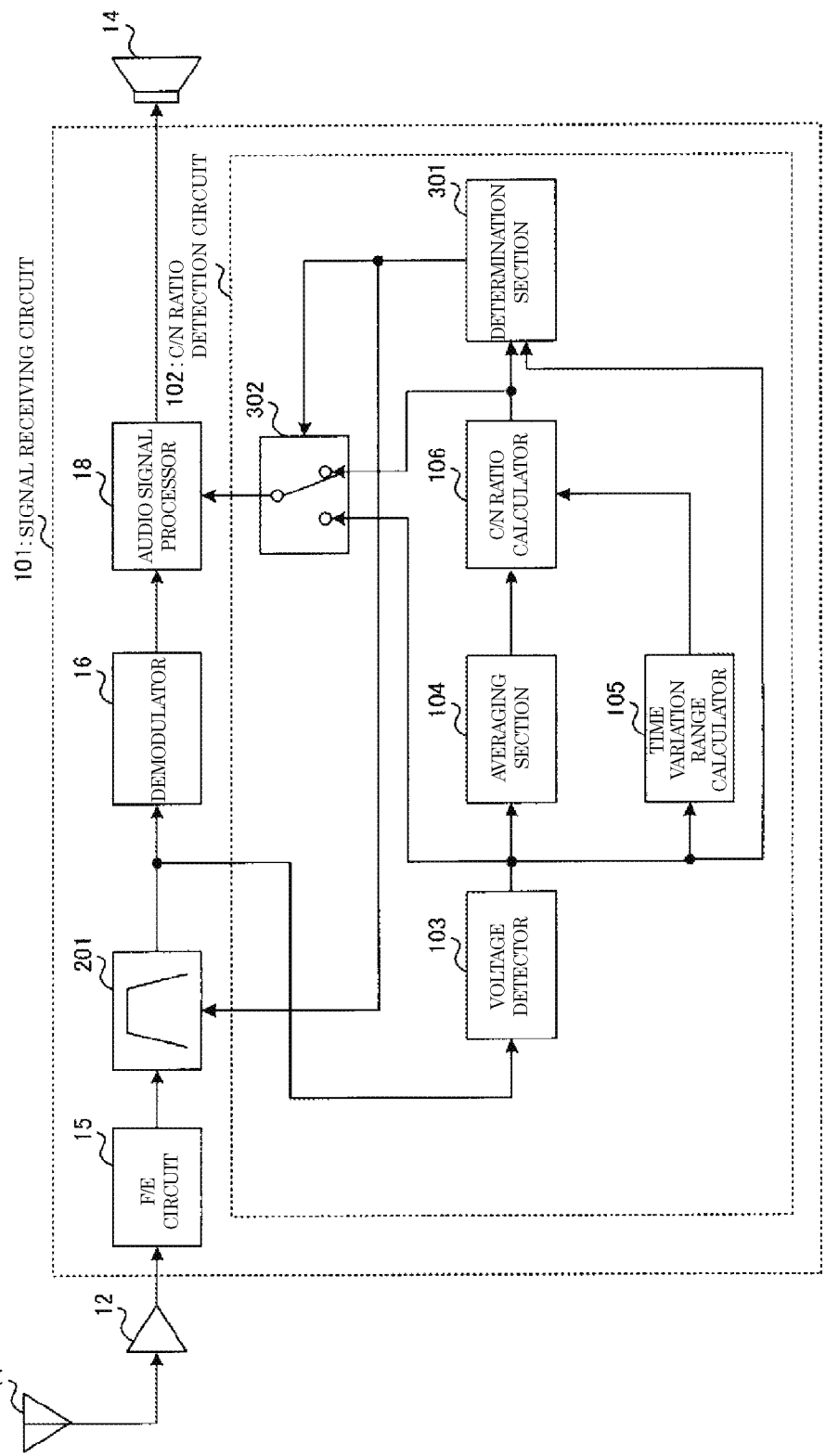
FIG. 16 is a block diagram illustrating another configuration of the radio receiver according to the third exemplary embodiment.

The determination result of determination section 301 may be used to control the bandwidth of bandpass filter 201. FIG. 16 is a block diagram illustrating a configuration of radio receiver 300a that controls the bandwidth of bandpass filter 201 by using the determination result of determination section 301. It should be noted that constituent elements in FIG. 16 which are substantially identical to constituent elements in FIG. 10 are denoted by identical reference numerals and will not be described in detail. Radio receiver 300a differs from radio receiver 300 in FIG. 10 in that determination section 301 outputs its determination result also to bandpass filter 201.

For example, when the determination result of determination section 301 indicates that the bandwidth of bandpass filter 201 is narrower than the occupied bandwidth of the input signal, bandpass filter 201 increases the bandwidth of a bandpass filter to be used. In this way, radio receiver 300a can avoid the state where the bandwidth of bandpass filter 201 is narrower than the occupied bandwidth of the input signal. More specifically, radio receiver 300a can avoid an occurrence of the state where the bandwidth of bandpass filter 201 is narrower than the occupied bandwidth of the input signal, and thus can appropriately perform audio signal processes by using a C/N ratio. This can improve distortion of audio quality degraded in radio receiver 300a when the bandwidth of bandpass filter 201 is narrower than the occupied bandwidth of the input signal.

The third exemplary embodiment has described the case where determination section 301 determines whether the bandwidth of bandpass filter 201 is narrower than the occupied bandwidth of the input signal, based on the difference between an S meter and a C/N ratio. Alternatively, determination section 301 may determine whether the bandwidth of bandpass filter 201 is narrower than the occupied bandwidth of the input signal, based on a C/N ratio. In FIG. 14, for example, determination section 301 may determine that the current state is the normal state when the C/N ratio is equal to or more than a ratio of S meter X to noise level (Y+Z), namely, X−(Y+Z). In FIG. 14, for example, determination section 301 may determine that the bandwidth of bandpass filter 201 is narrower than the occupied bandwidth of the input signal when the C/N ratio is less than a ratio of S meter X to noise level (Y+Z), namely, X−(Y+Z). In this case, as described above, the threshold used for the determination in determination section 301 may be set to (X−(Y+Z)+margin) with a time fluctuation of the C/N ratio taken into consideration.

Fourth Exemplary Embodiment

[Configuration of Radio Receiver]

Figure 17:
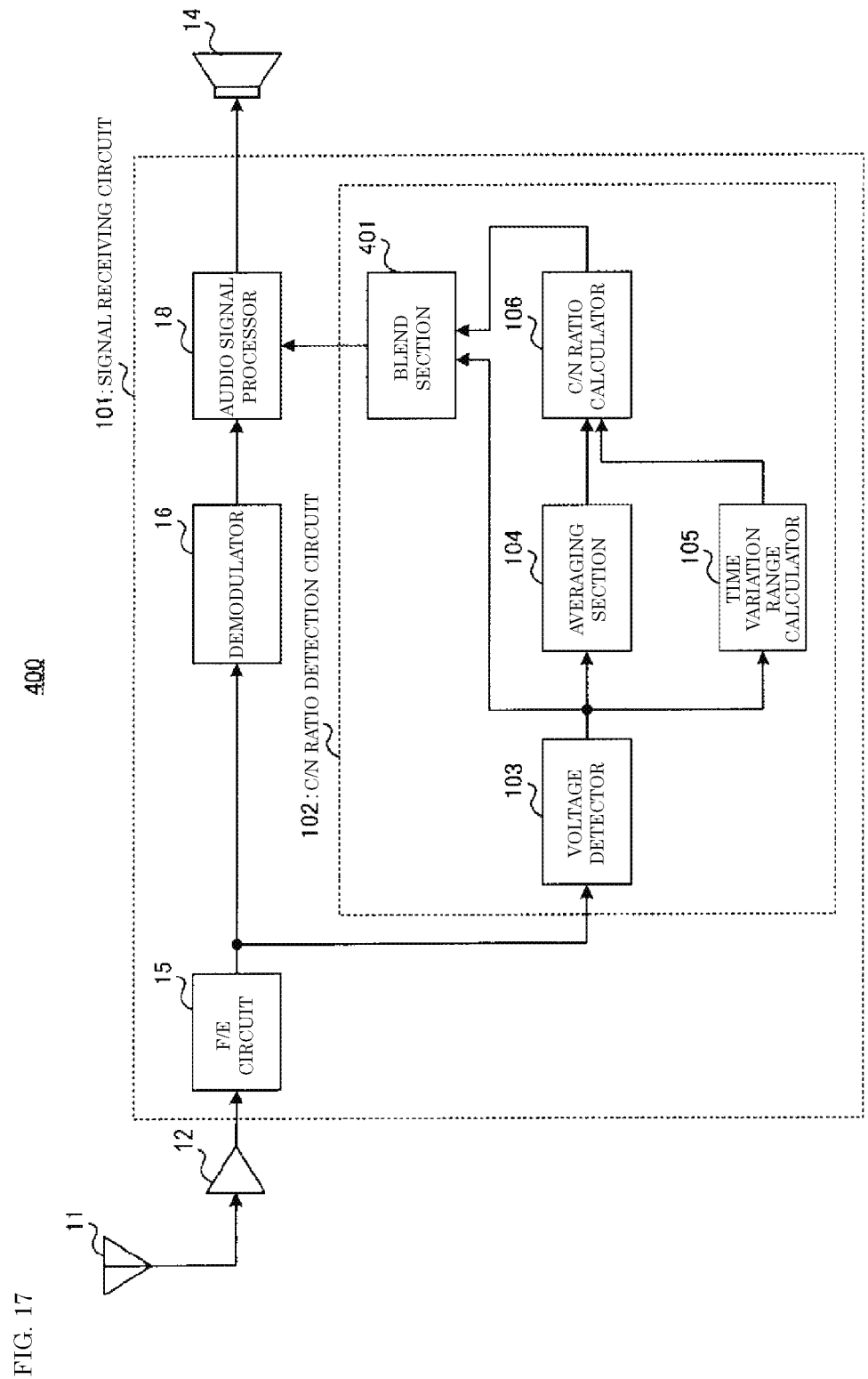
FIG. 17 is a block diagram illustrating a C/N ratio detection circuit in a fourth exemplary embodiment.

FIG. 17 is a block diagram illustrating a configuration of radio receiver 400 according to a fourth exemplary embodiment. It should be noted that constituent elements in FIG. 17 which are substantially identical to constituent elements in the first exemplary embodiment in FIG. 4 are denoted by identical reference numerals and will not be described in detail.

The fourth exemplary embodiment differs from the first exemplary embodiment in that blend section 401 is provided in C/N ratio detection circuit 102.

In C/N ratio detection circuit 102, blend section 401 receives an input voltage output from voltage detector 103 (which corresponds to an S meter herein similarly to the first exemplary embodiment). In parallel, blend section 401 receives a C/N ratio output from C/N ratio calculator 106. In addition, applicable upper limit CNR_lim of a C/N ratio and threshold S_lim that indicates an applicable lower limit of an S meter are preset in blend section 401. In this case, threshold Slim is larger than applicable upper limit CNR_lim.

Blend section 401 selects one of input C/N ratio and S meter or interpolates both the C/N ratio and the S meter, in accordance with the C/N ratio and the S meter. Then, blend section 401 outputs a resultant blend value to audio signal processor 18.

More specifically, if the input C/N ratio is equal to or less than applicable upper limit CNR_lim, blend section 401 outputs the C/N ratio as a blend value to audio signal processor 18. If the input C/N ratio is larger than applicable upper limit CNR_lim and the input S meter is equal to or more than threshold S_lim, blend section 401 outputs the S meter as a blend value to audio signal processor 18.

If the received C/N ratio is larger than applicable upper limit CNR_lim and the input S meter is less than threshold Slim, blend section 401 outputs an interpolated value as a blend value to audio signal processor 18. The interpolated value is obtained by interpolating the received C/N ratio and S meter.

Audio signal processor 18 performs various audio signal processes by using the blend value input from blend section 401.

[Blend Process]

A blend process to be performed by blend section 401 will be described below in detail.

The upper limit of the dynamic range of a C/N ratio depends on calculation accuracy of time variation range calculator 105. When a C/N ratio increases, cancellation of significant digits may occur, and thus the calculation accuracy degrades. As a result, a C/N ratio tends to be saturated in an intermediate electric field, such as an electric field of about 40 dBµV, or a strong electric field.

Figure 18:
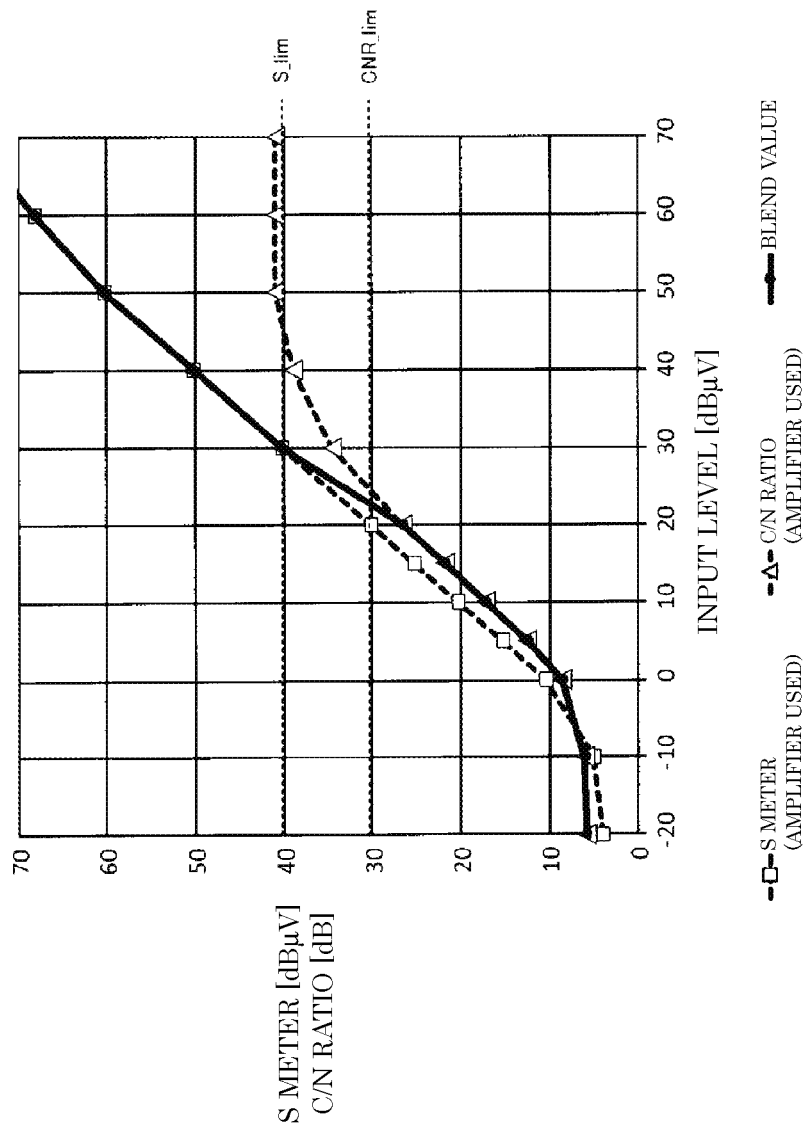
FIG. 18 is a diagram illustrating a result of measuring a C/N ratio and an S meter in the fourth exemplary embodiment.

FIG. 18 illustrates a result of measuring a C/N ratio and an S meter in an intermediate electric field (40 dBµV) and a strong electric field. The result in FIG. 18 is obtained under the condition of antenna amplifier 12 being used.

When the input level is in the range from 0 dBµV to 70 dBµV both inclusive, the S meter exhibits a linear property. The C/N ratio also exhibits a linear property when the input level is equal to less than 30 dBµV but is saturated at about 40 dB when the input level is in the range from 40 dBµV to 70 dBµV both inclusive.

Unfortunately, the dynamic range of a C/N ratio measured by C/N ratio detection circuit 102 is narrower than the dynamic range of an S meter. This means that a C/N ratio detected by C/N ratio detection circuit 102 may be unsuitable for use as an index for audio signal processes in an intermediate or strong electric field.

In short, an S meter is more suitable for use as an index for audio signal processes than a C/N ratio in an intermediate or strong electric field. However, if one of a C/N ratio and an S meter is selectively used as an index for audio signal processes, audio signal processor 18 needs to switch between processes using the C/N ratio and the S meter, in accordance with the input level. This may lead to complicated control of audio signal processes.

Therefore, blend section 401 in C/N ratio detection circuit 102 blends input C/N ratio and S meter together in accordance with values of the C/N ratio and the S meter, and then outputs a resultant blend value. In other words, blend section 401 combines input C/N ratio and S meter into a single blend value so that control of audio signal processor 18 is not complicated.

An example of a blend process in blend section 401 will be described.

First, blend section 401 sets applicable lower limit S_lim of an S meter and applicable upper limit CNR_lim of a C/N ratio. Then, blend section 401 determines which of the following states (1) to (3) occur; (1) the S meter is equal to or more than applicable lower limit S_lim; (2) the C/N ratio is equal to or less than applicable upper limit CNR_lim; and (3) neither (1) nor (2) occurs.

In state (1), blend section 401 outputs the S meter to audio signal processor 18.

In state (2), blend section 401 outputs the C/N ratio to audio signal processor 18.

In state (3), for example, blend section 401 calculates the difference between the S meter and applicable lower limit S_lim (ΔS=S_lim−S meter) and the difference between the C/N ratio and CNR_lim (ΔCNR=C/N ratio−CNR_lim). Then, blend section 40 calculates internal division ratio k. For example, internal division ratio k may be expressed by the equation: k=ΔCNR/(ΔS+ΔCNR). In this case, blend section 401 calculates a blend value in such a manner that k×S meter+(1−k)×C/N ratio.

FIG. 18 illustrates an example of a blend value output from blend section 401.

In FIG. 18, when the C/N ratio is equal to or less than 30 dB (=CNR_lim), namely, when state (2) occurs, blend section 401 selects the C/N ratio. When the S meter is equal to or more than 40 dBμV (=S_lim), namely, when state (1) occurs, blend section 401 selects the S meter. When the CN ratio is more than 30 dB and the S meter is less than 40 dBμV, namely, when state (3) occurs, blend section 401 calculates a linear complementary value between the C/N ratio and the S meter as a blend value.

In the fourth exemplary embodiment, as described above, C/N ratio detection circuit 102 includes blend section 401 that blends input S meter and C/N ratio together to provide a single value as a blend value. When a C/N ratio is equal to or less than applicable upper limit CNR_lim, blend section 401 outputs the C/N ratio. When a C/N ratio is more than applicable upper limit CNR_lim, blend section 401 outputs an input voltage, namely, an S meter or an interpolated value obtained by interpolating the C/N ratio and the S meter.

In the above way, radio receiver 400 can perform audio signal processes in a weak electric field in accordance with an accurate C/N ratio, similarly to the first exemplary embodiment. Furthermore, radio receiver 400 can also perform the audio signal processes appropriately in an intermediate or strong electric field in which the C/N ratio may degrade, in accordance with the S meter or an interpolated value. At this time, radio receiver 400 avoids using the degraded C/N ratio alone.

Since blend section 401 blends input S meter and C/N ratio together to provide a single value as an index for audio signal processor 18, complicated control of audio signal processor 18 can be avoided.

According to the fourth exemplary embodiment, blend section 401 provided in radio receiver 400 can help audio signal processor 18 perform audio signal processes smoothly in any of weak, intermediate, and strong electric fields.

It should be understood that a method for blending an S meter and a C/N ratio together is not limited to the above method. As an alternative example, different thresholds at which a C/N ratio is switched to an S meter and at which an S meter is switched to a C/N ratio may be preset to blend section 401, in consideration of hysteresis. In this case, the blend value is stable with time.

The first to fourth exemplary embodiments according to an aspect of the present disclosure have been described above.

The first to fourth exemplary embodiments have been described regarding the case where a radio receiver receives an analog FM radio signal. However, the first to fourth exemplary embodiments are also applicable to radio receivers that receive a radio signal conforming to a digital modulation scheme in which amplitude is kept constant, such as a frequency shift keying (FSK) scheme or a phase shift keying (PSK) scheme.

Some of the first to fourth exemplary embodiments may be combined together as appropriate. In the third or fourth exemplary embodiment, for example, a C/N ratio detection circuit may correct a time variation range of an input voltage, or an S meter, and may calculate a C/N ratio by using the corrected time variation range, similarly to the second exemplary embodiment.

INDUSTRIAL APPLICABILITY

The present disclosure is effective as a circuit that determines quality of the received signal, in a radio signal receiver that employs a modulation scheme with which an amplitude is kept constant.

REFERENCE MARKS IN THE DRAWINGS

10, 100, 200, 300, 300a, 400 radio receiver
11 antenna
12, 23 antenna amplifier
14 speaker
15 front-end (F/E) circuit
16 demodulator
17 S meter detector
18 audio signal processor
21 reference signal source
22 antenna dummy circuit
13, 24, 101 signal receiving circuit
102 C/N ratio detection circuit
103 voltage detector
104 averaging section
105 time variation range calculator
106 C/N ratio calculator
201 bandpass filter
202 time variation range correction section
301 determination section
302 switch
401 blend section

The invention claimed is:
1. A signal receiving circuit comprising:
a bandpass filter that receives an input signal through an antenna and selectively outputs a signal of a predetermined bandwidth in the input signal;
a demodulator that demodulates the signal outputted from the bandpass filter;

a carrier to noise (C/N) ratio detection circuit that calculates a C/N ratio of the signal outputted from the bandpass filter, the C/N ratio detection circuit, which in operation operates as:
  a voltage detector that measures an input voltage of the signal output from the bandpass filter;
  an averaging section that calculates an average of a number of voltages from the voltage detector over a predetermined time;
  a time variation range calculator that calculates a first time variation range of the voltages over the predetermined time; and
  a C/N ratio calculator that calculates the C/N ratio of the signal by using based on the average and a second time variation range; and
an audio signal processor that applies an audio signal process to the demodulated signal outputted from the demodulator, and outputs an audio signal generated by the audio signal process to a speaker, in accordance with the C/N ratio inputted from the carrier to noise (C/N) ratio detection circuit, wherein:
the carrier to noise (C/N) ratio detection circuit makes a determination to correct the first time variation range such that the first time variation range becomes a noise level reference value set in accordance with the bandwidth of the bandpass filter, and outputs the corrected first time variation range as the second time variation range, when the first time variation range is less than the noise level reference value, and
the carrier to noise (C/N) ratio detection circuit makes a determination to not correct the first time variation range, and outputs the first time variation range as the second time variation range, when the first time variation range is greater than or equal to the noise level reference value.

2. The signal receiving circuit according to claim 1, wherein
  the voltage detector is electrically connected to an output terminal of a bandpass filter and measures a voltage of a signal output from the bandpass filter as the input voltage, and
  the C/N ratio detection circuit further comprises
    a determination section that compares the input voltage with the C/N ratio to determine whether a bandwidth of the bandpass filter is narrower than an occupied bandwidth of the signal, and
    a switch that outputs the input voltage when the determination section determines that the bandwidth of the bandpass filter is narrower than the occupied bandwidth of the signal and that outputs the C/N ratio when the determination section determines that the bandwidth of the bandpass filter is not narrower than the occupied bandwidth of the signal.

3. The signal receiving circuit according to claim 1, wherein the C/N ratio detection circuit further comprises:
  a determination section that determines whether a difference between the input voltage and the C/N ratio is equal to or less than a threshold; and
  a switch that outputs the input voltage when the difference is more than the threshold and that outputs the C/N ratio when the threshold is equal to or less than the threshold.

4. The signal receiving circuit according to claim 1, wherein the C/N ratio detection circuit further comprises:
  a blend section that outputs the C/N ratio when the C/N ratio is equal to or less than a first threshold and that outputs the input voltage or an interpolated value obtained by interpolating the C/N ratio and the input voltage when the C/N ratio is more than the first threshold.

5. The signal receiving circuit according to claim 4, wherein
  the blend section outputs the input voltage when the C/N ratio is more than the first threshold and the input voltage is equal to or more than a second threshold, the second threshold being more than the first threshold, and outputs the interpolated value when the C/N ratio is more than the first threshold and the input voltage is less than the second threshold.

6. The signal receiving circuit according to claim 1, wherein
  the C/N ratio calculator calculates, as the C/N ratio, a ratio of a square of the average to a product of a square of the time variation range and a constant.

* * * * *